United States Patent
Divakaruni et al.

(10) Patent No.: US 9,634,006 B2
(45) Date of Patent: Apr. 25, 2017

(54) THIRD TYPE OF METAL GATE STACK FOR CMOS DEVICES

(71) Applicant: International Business Machines Corporation, Armonk, NY (US)

(72) Inventors: Ramachandra Divakaruni, Ossining, NY (US); Sameer H. Jain, Beacon, NY (US); Viraj Y. Sardesai, Poughkeepsie, NY (US); Keith H. Tabakman, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 14/193,849

(22) Filed: Feb. 28, 2014

(65) Prior Publication Data

US 2015/0249086 A1 Sep. 3, 2015

(51) Int. Cl.

| H01L 29/66 | (2006.01) |
|---|---|
| H01L 27/092 | (2006.01) |
| H01L 21/762 | (2006.01) |
| H01L 21/8238 | (2006.01) |
| H01L 21/84 | (2006.01) |
| H01L 27/12 | (2006.01) |

(52) U.S. Cl.
CPC ...... *H01L 27/092* (2013.01); *H01L 21/76224* (2013.01); *H01L 21/823842* (2013.01); *H01L 21/823878* (2013.01); *H01L 21/84* (2013.01); *H01L 27/1203* (2013.01)

(58) Field of Classification Search
CPC ........... H01L 29/4958; H01L 29/66545; H01L 21/768; H01L 21/823842
See application file for complete search history.

(56) References Cited

U.S. PATENT DOCUMENTS

| 5,453,400 | A | 9/1995 | Abernathey et al. | |
| 2001/0027006 | A1* | 10/2001 | Kim | B60N 3/102 |
| | | | | 438/592 |
| 2004/0188726 | A1* | 9/2004 | Iriyama | H01L 21/76895 |
| | | | | 257/288 |
| 2009/0206415 | A1* | 8/2009 | Chiang | H01L 21/82384 |
| | | | | 257/369 |
| 2012/0012937 | A1* | 1/2012 | Chew | H01L 21/28088 |
| | | | | 257/369 |

(Continued)

*Primary Examiner* — John C Ingham
*Assistant Examiner* — Frederick B Hargrove
(74) *Attorney, Agent, or Firm* — Scully, Scott, Murphy & Presser, P.C.; Steven J. Meyers

(57) ABSTRACT

A third type of metal gate stack is provided above an isolation structure and between a replacement metal gate n-type field effect transistor and a replacement metal gate p-type field effect transistor. The third type of metal gate stack includes at least three different components. Notably, the third type of metal gate stack includes, as a first component, an n-type workfunction metal layer, as a second component, a p-type workfunction metal layer, and as a third component, a low resistance metal layer. In some embodiments, the uppermost surface of the first, second and third components of the third type of metal gate stack are all substantially coplanar with each other. In other embodiments, an uppermost surface of the third component of the third type of metal gate stack is non-substantially coplanar with an uppermost surface of both the first and second components of the third type of metal gate stack.

13 Claims, 33 Drawing Sheets

(56) References Cited

U.S. PATENT DOCUMENTS

| | | |
|---|---|---|
| 2012/0085733 A1 | 4/2012 | Mebarki et al. |
| 2013/0095662 A1 | 4/2013 | Liu et al. |
| 2013/0320410 A1* | 12/2013 | Lin .................. H01L 29/78 257/288 |
| 2014/0197480 A1* | 7/2014 | Han .................. H01L 29/7827 257/330 |

* cited by examiner

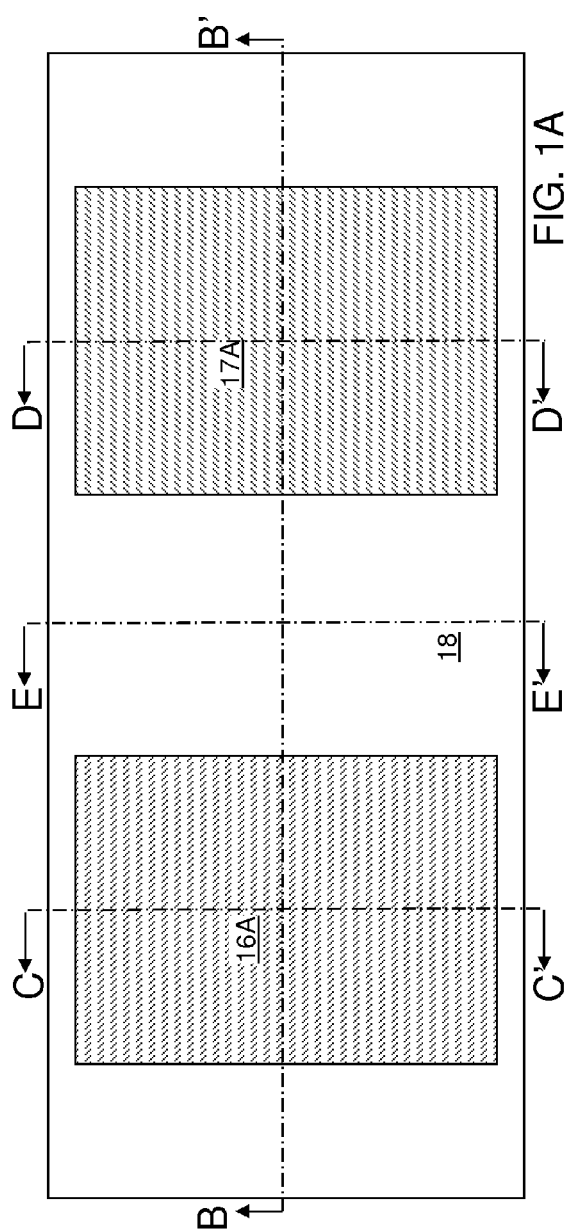

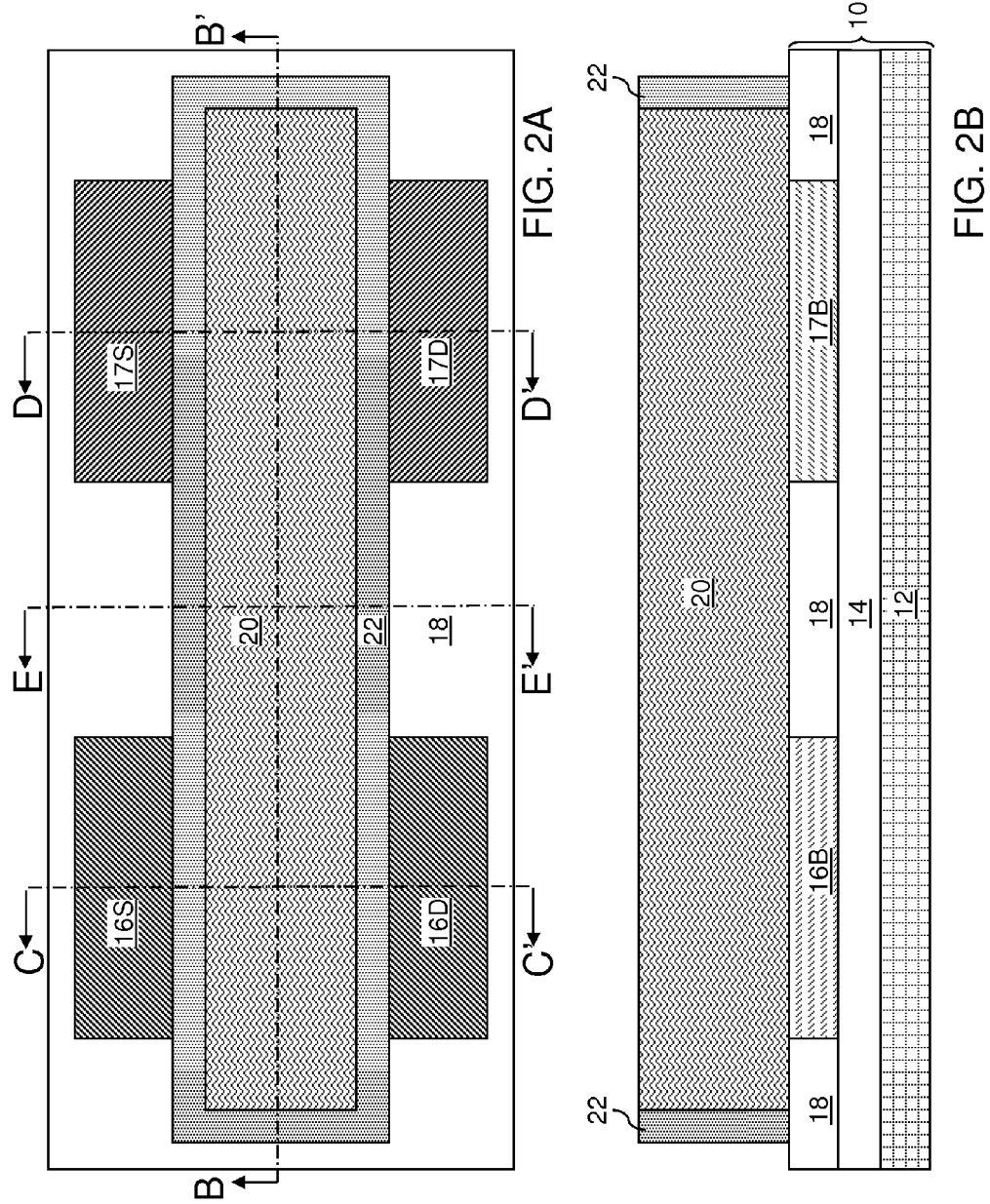

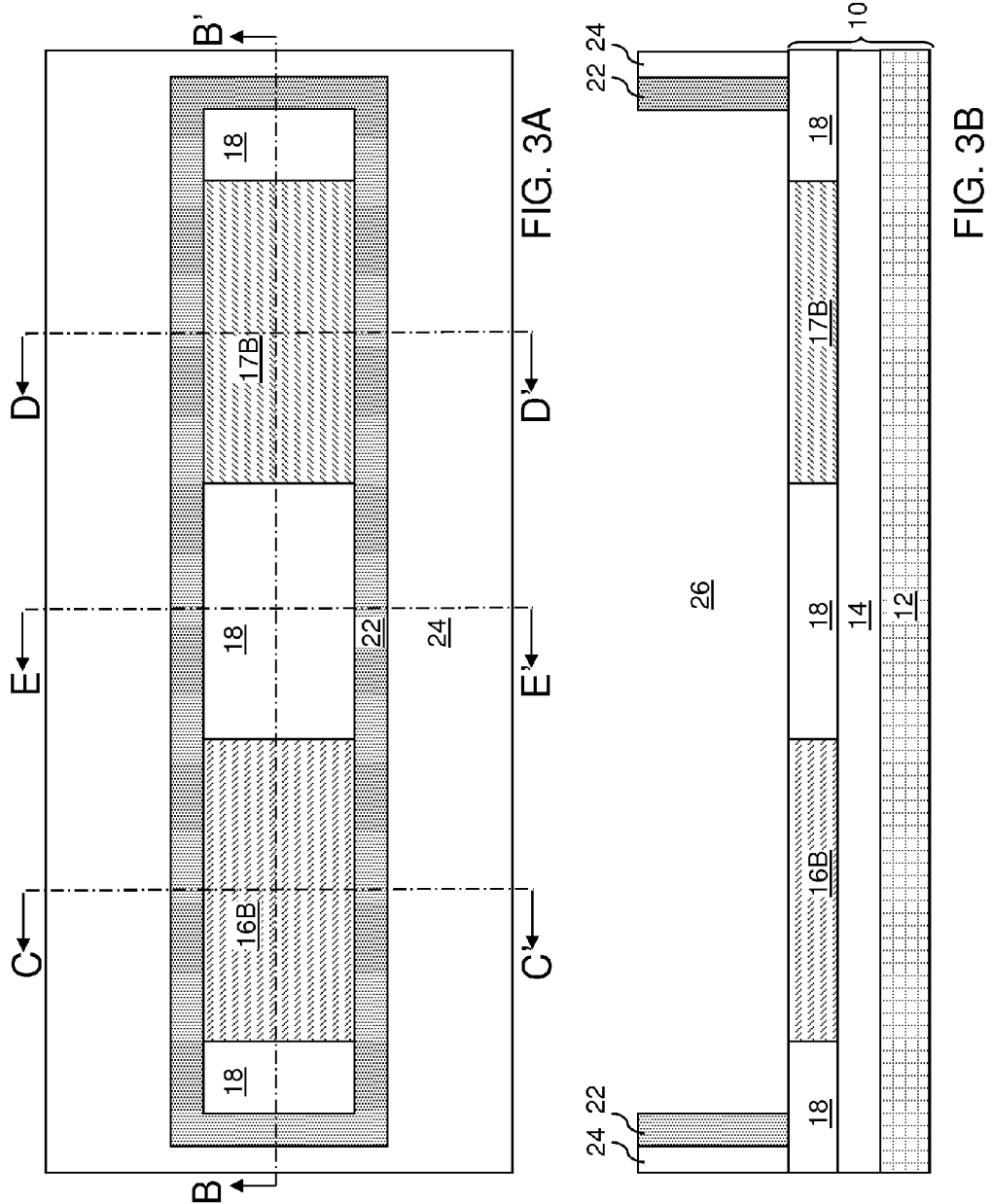

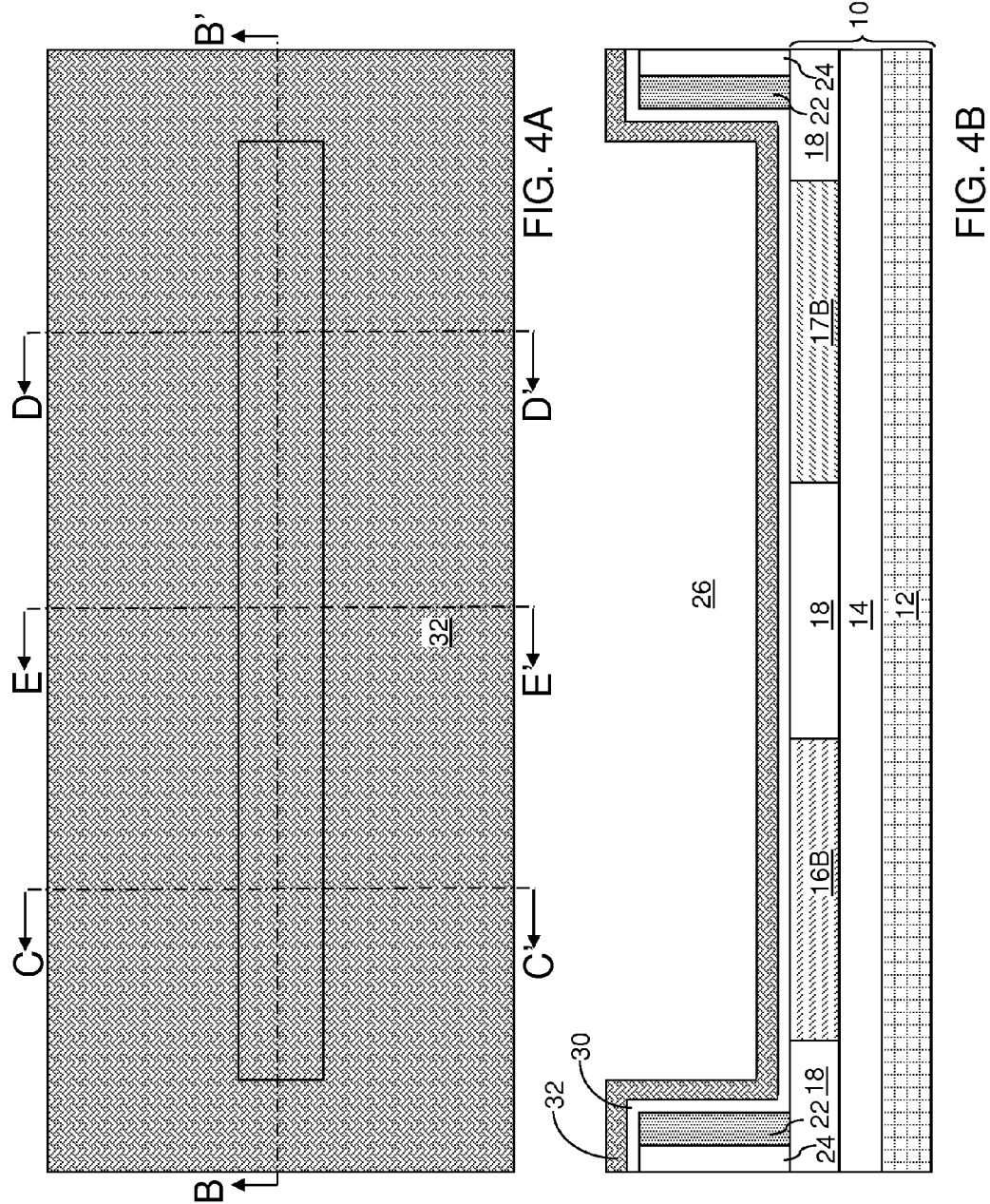

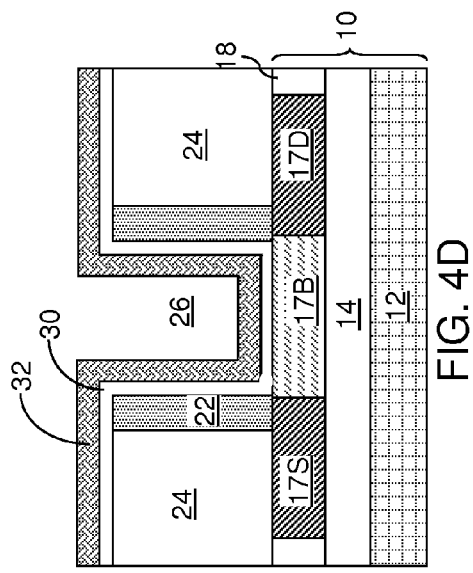
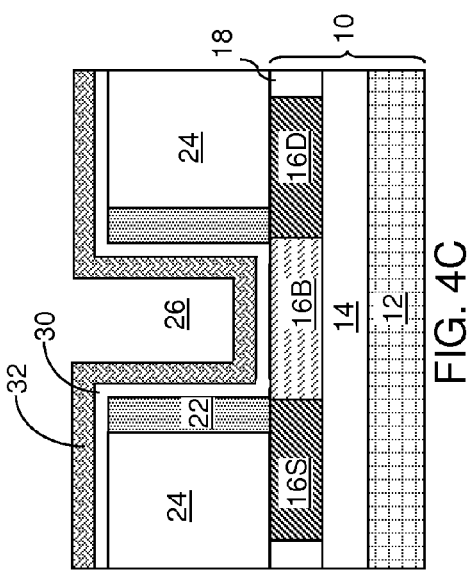
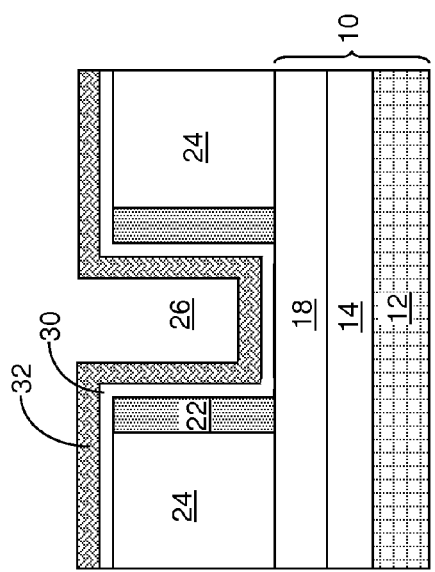

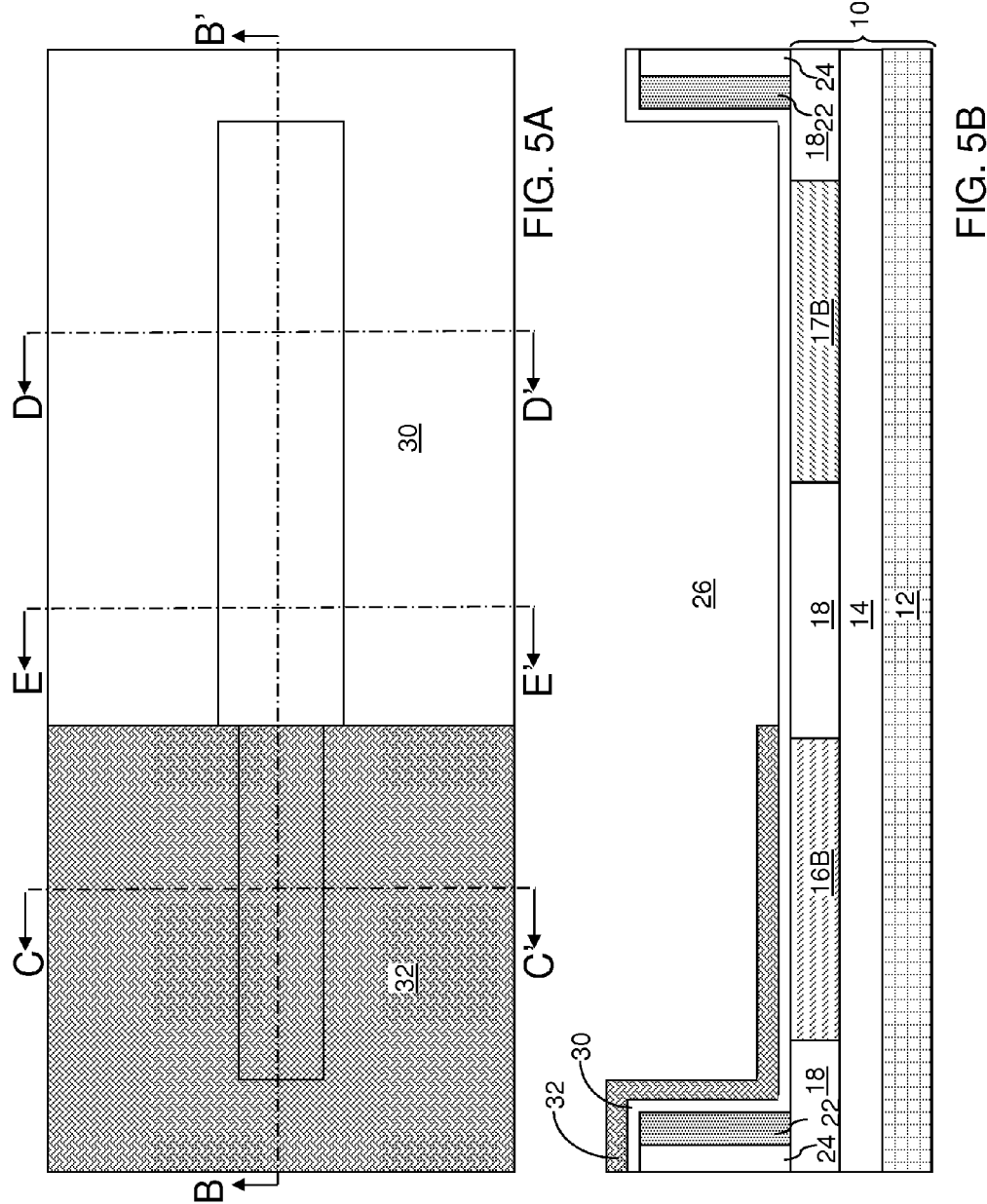

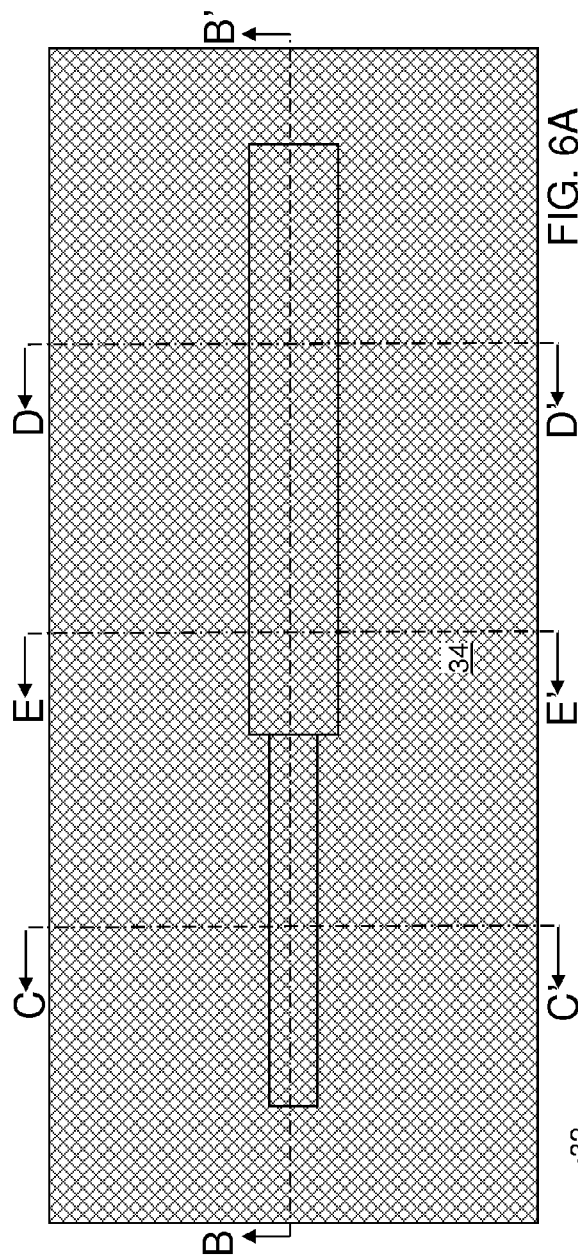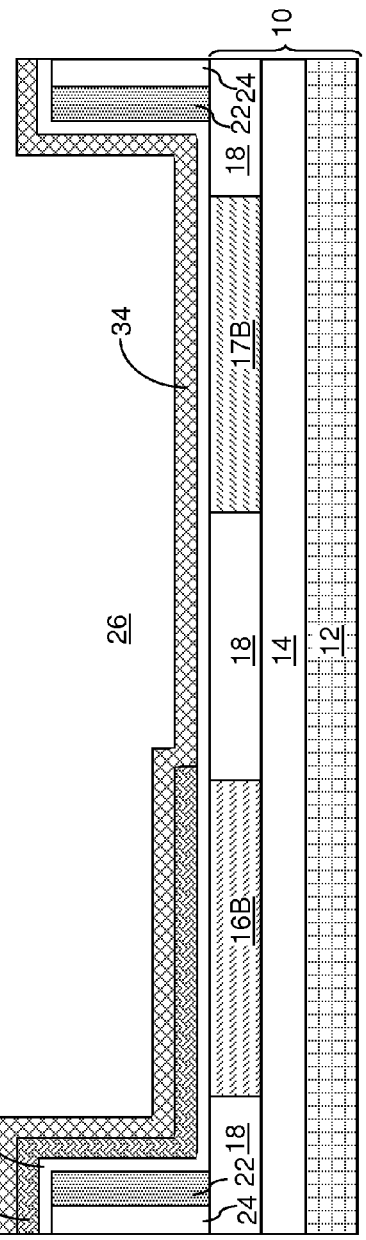
FIG. 6A
FIG. 6B

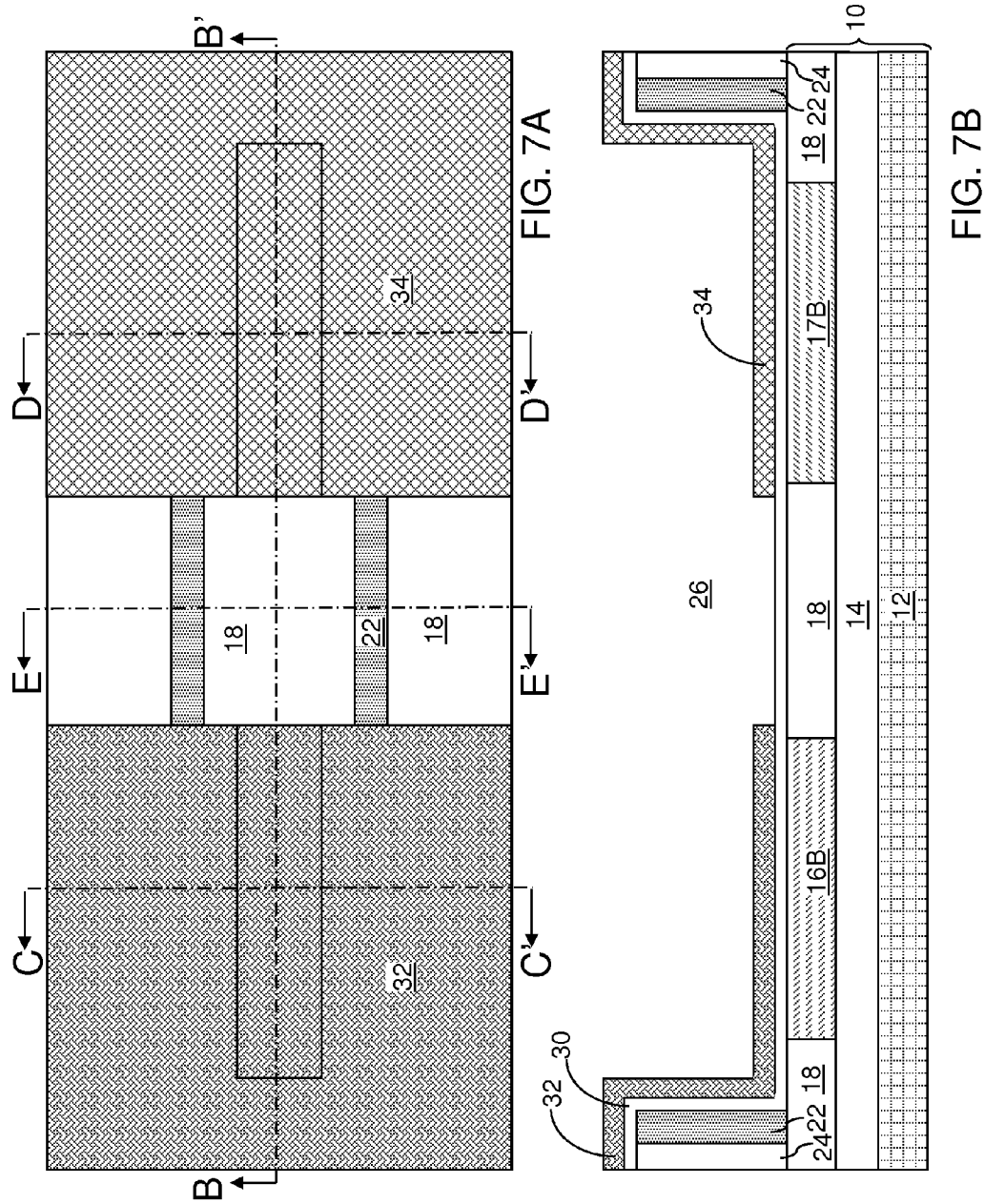

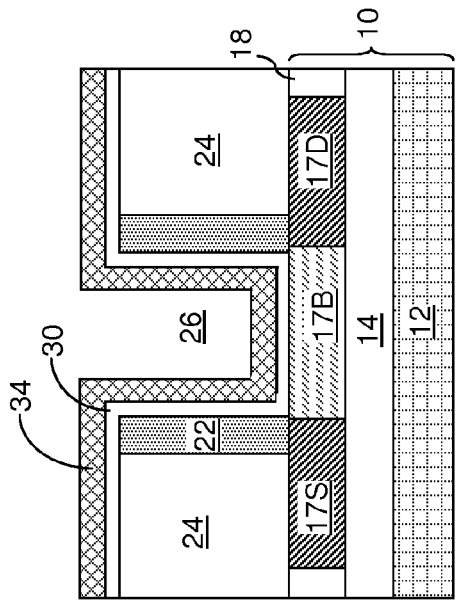
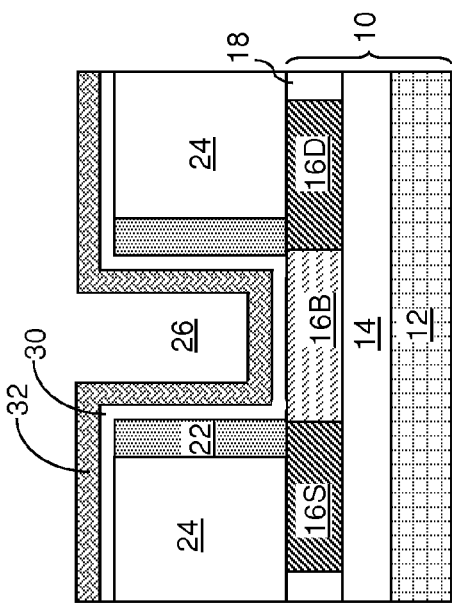
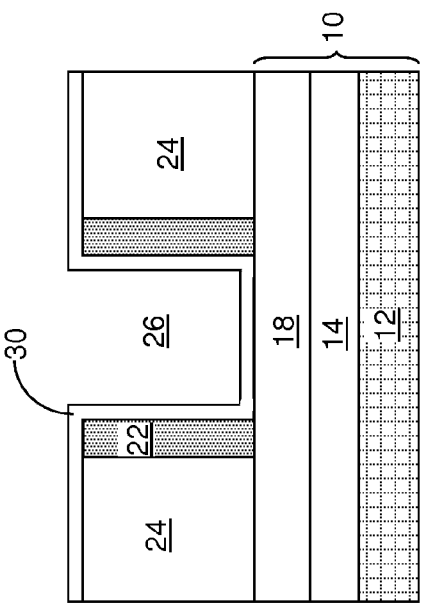
FIG. 7C
FIG. 7D
FIG. 7E

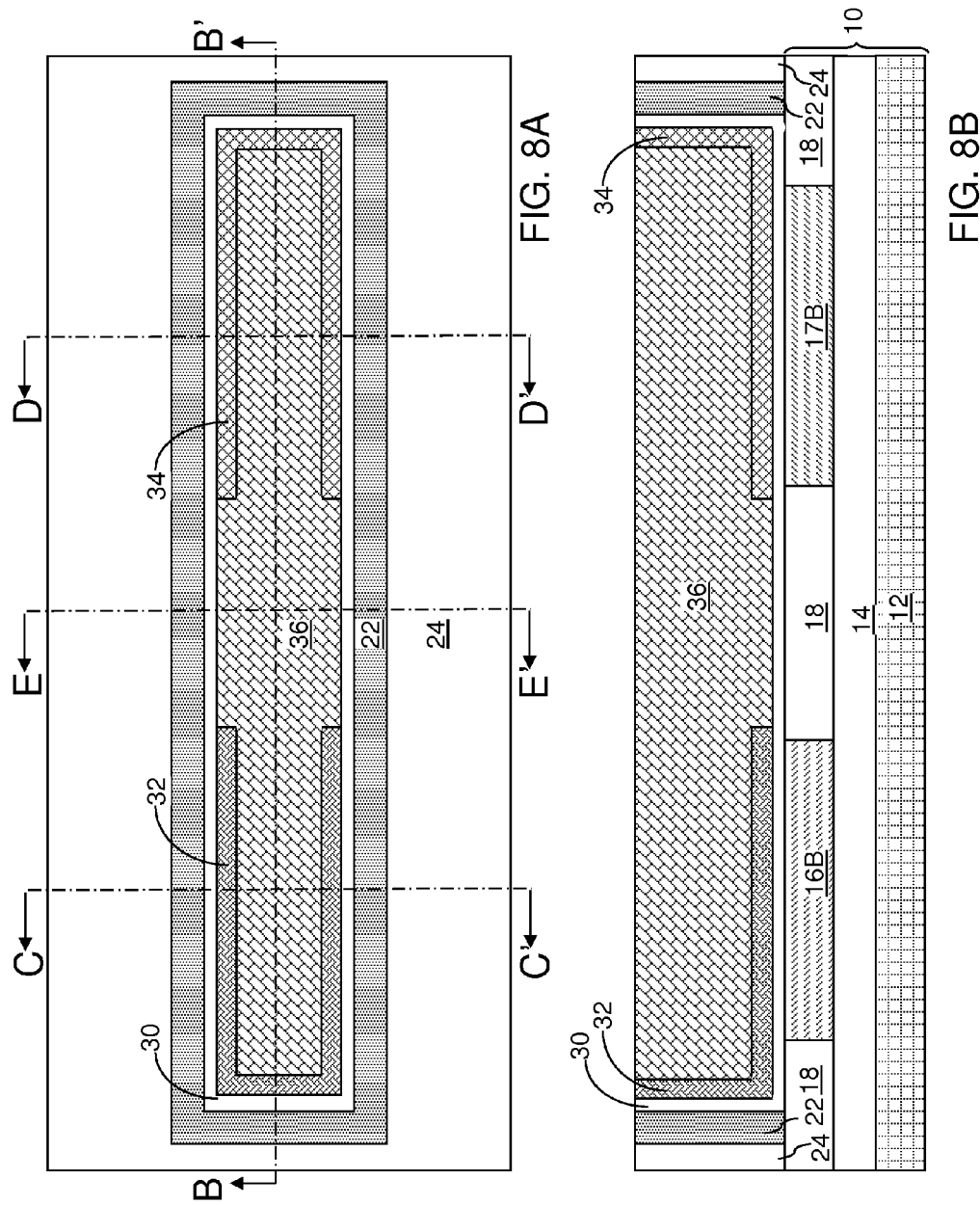

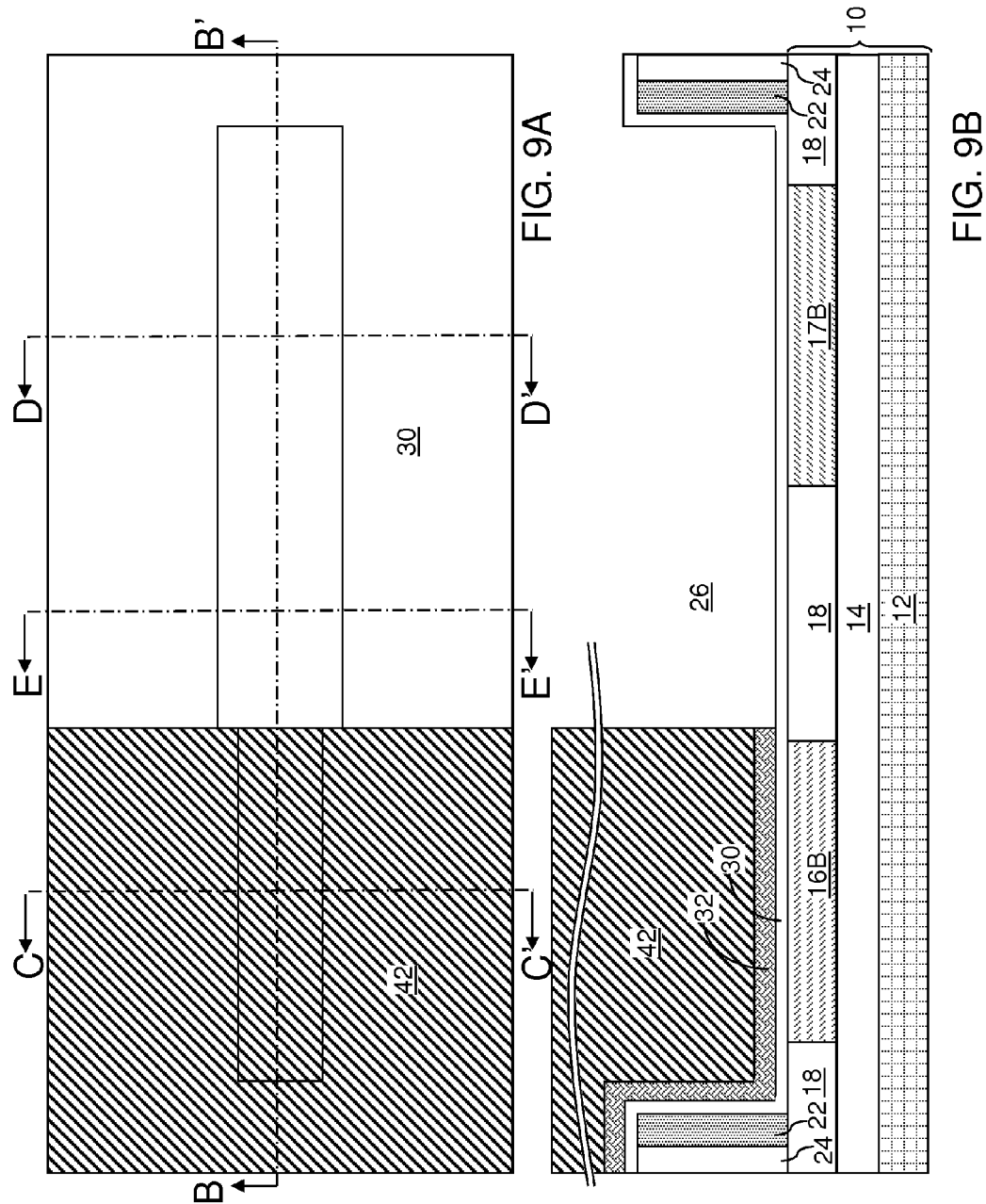

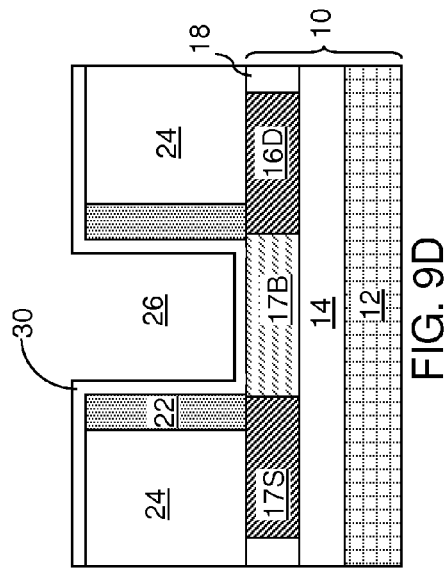
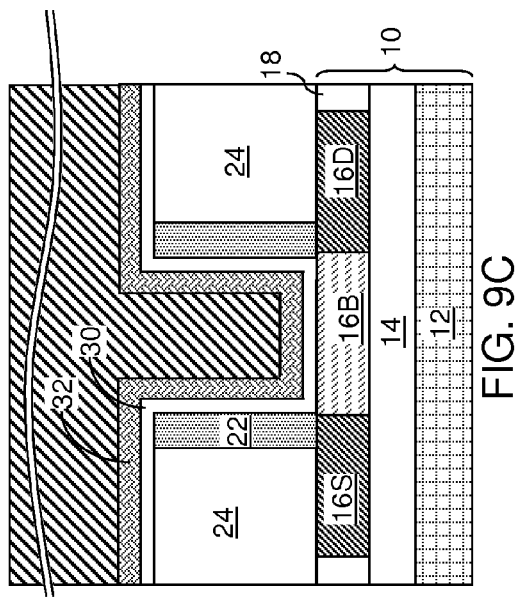
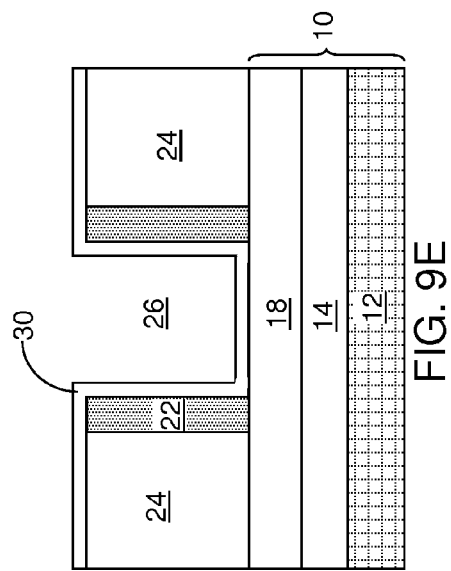
FIG. 9C
FIG. 9D
FIG. 9E

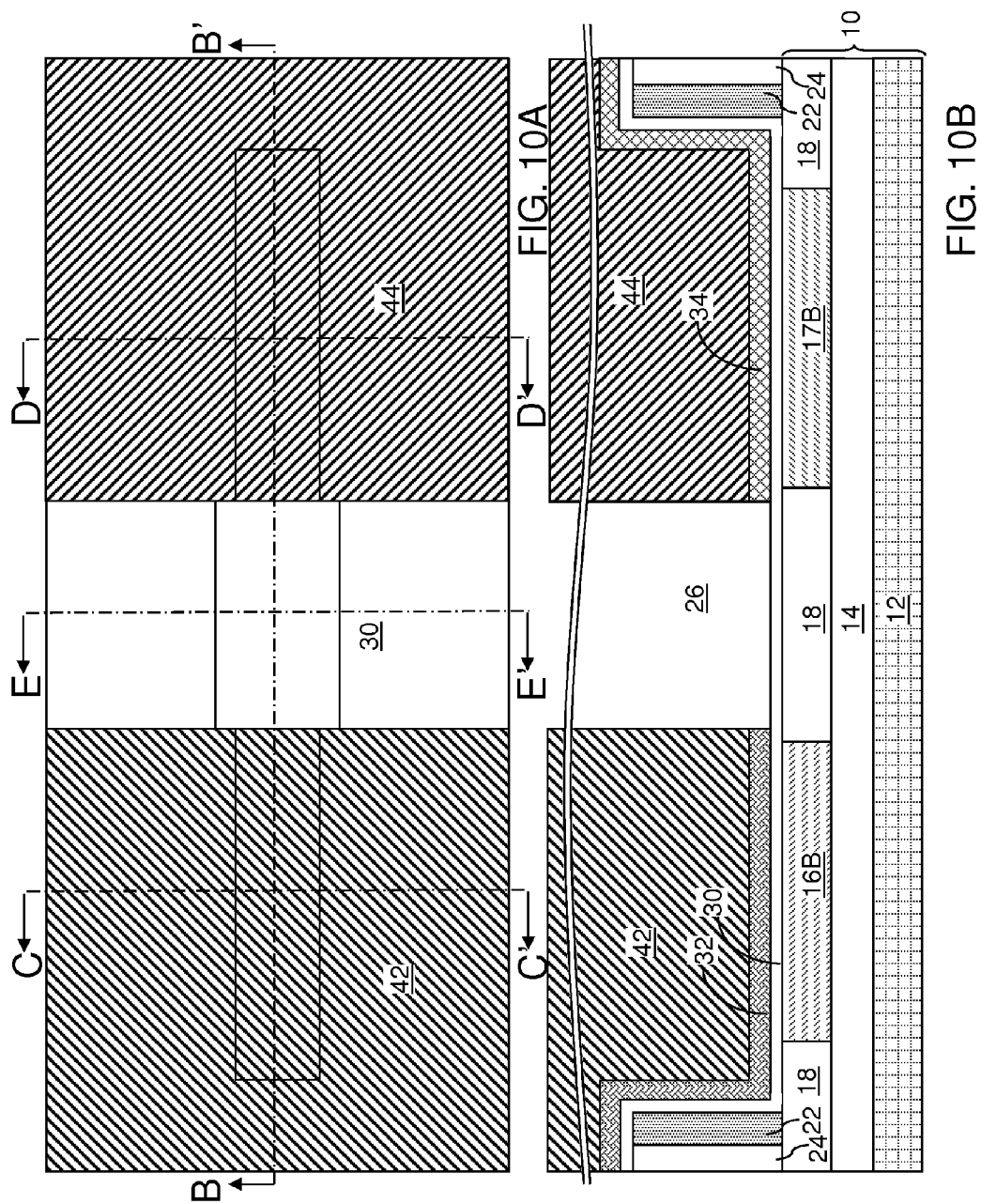

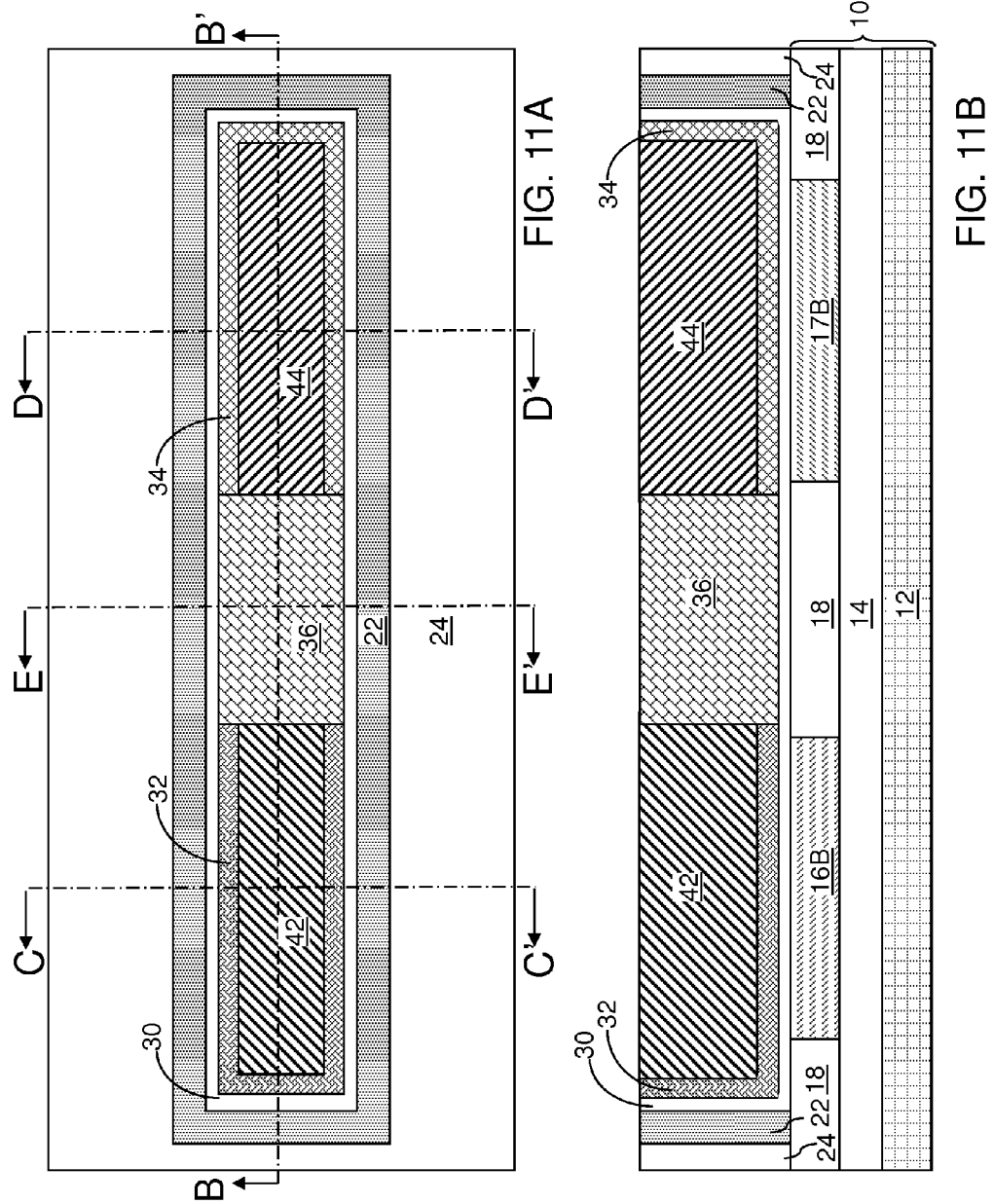

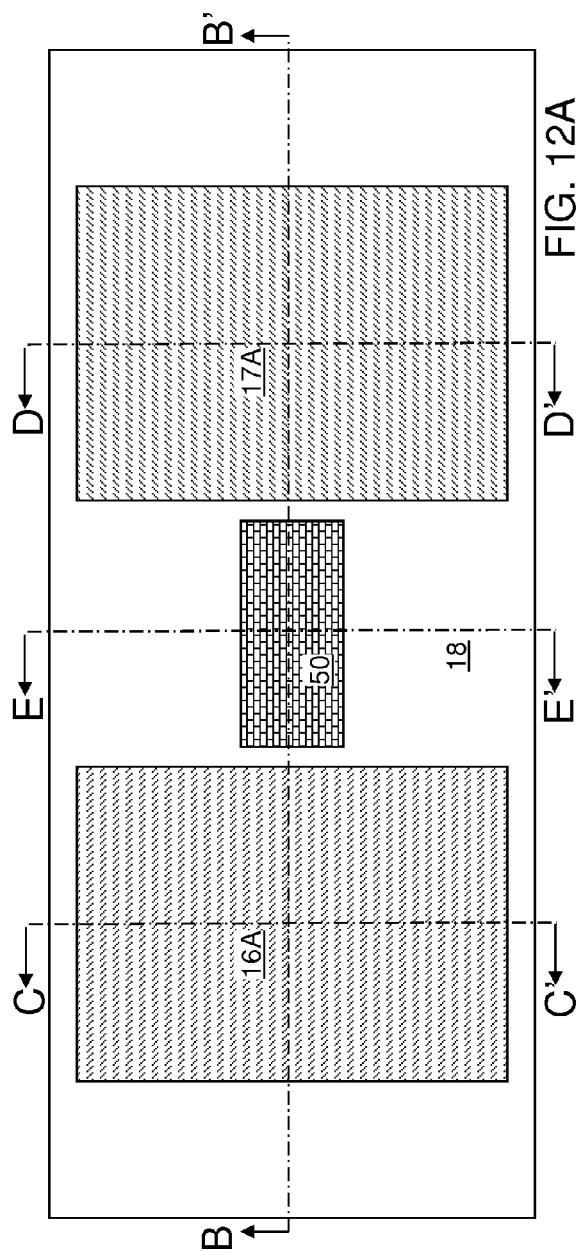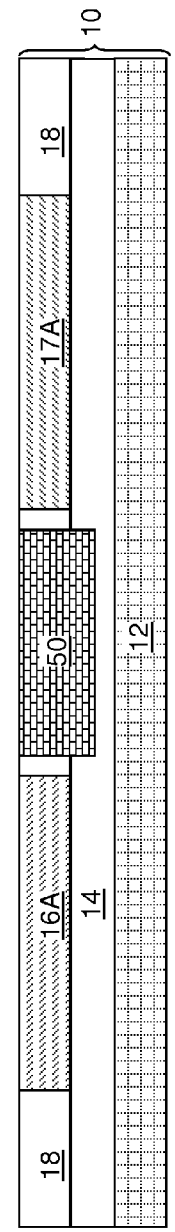
FIG. 12A
FIG. 12B

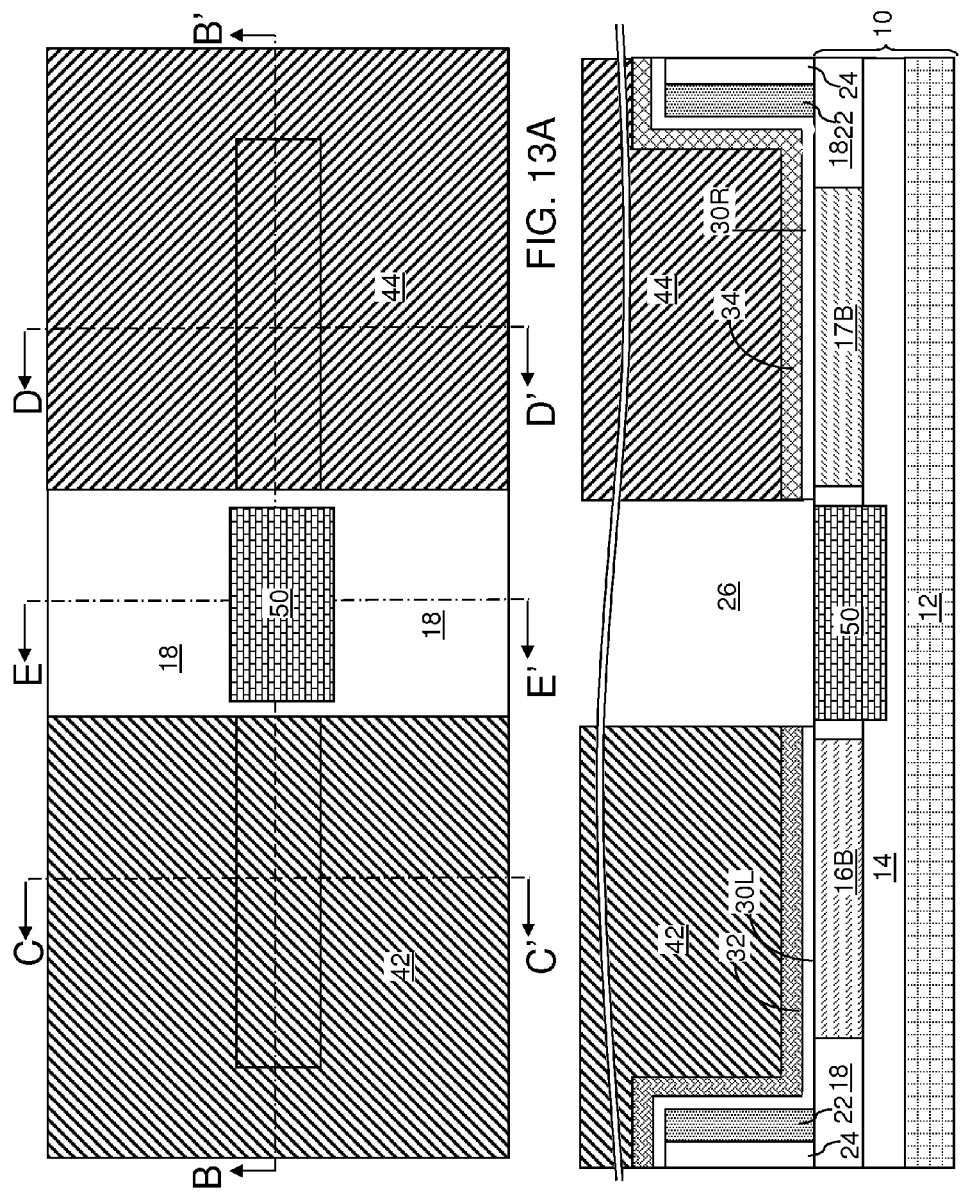

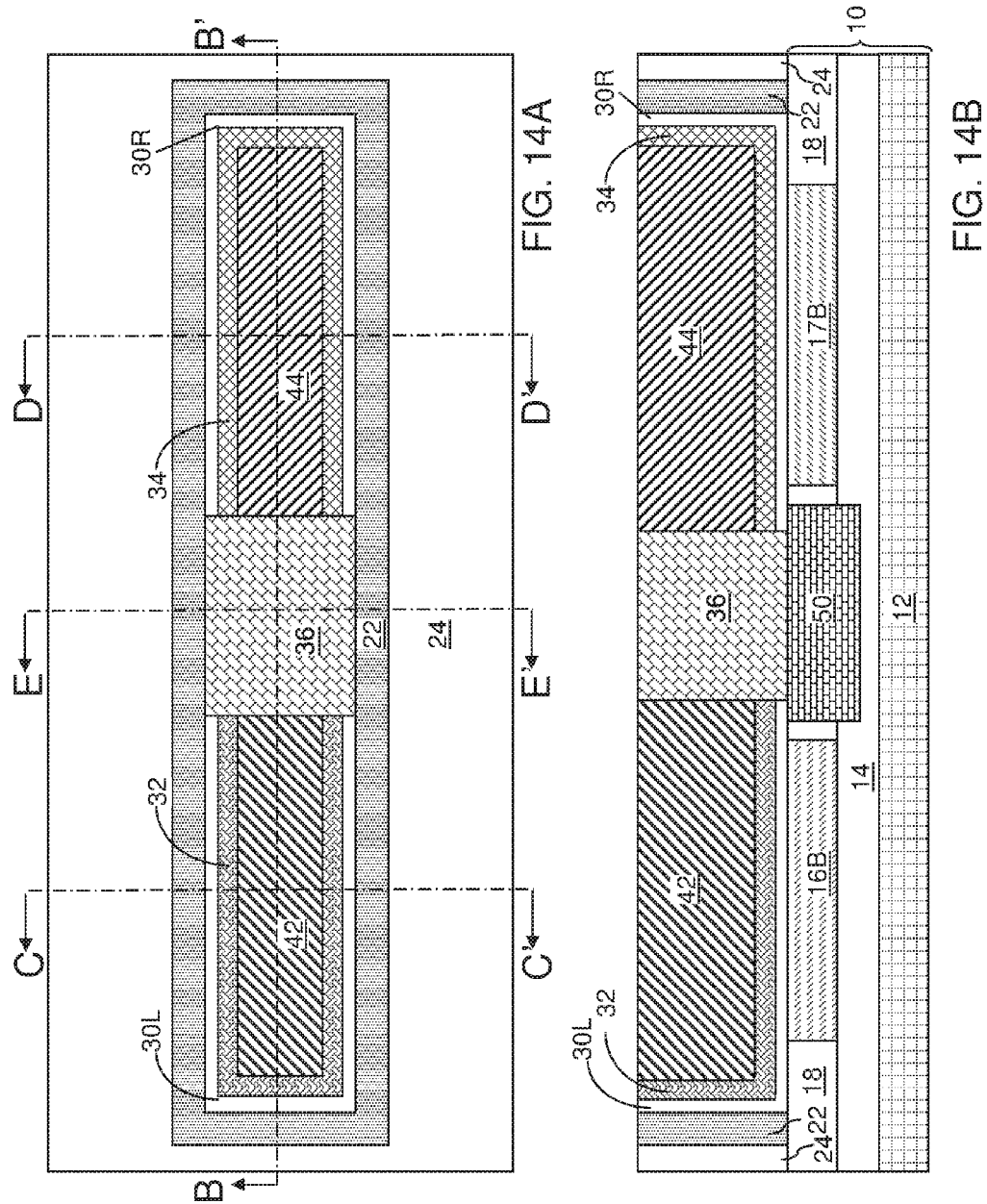

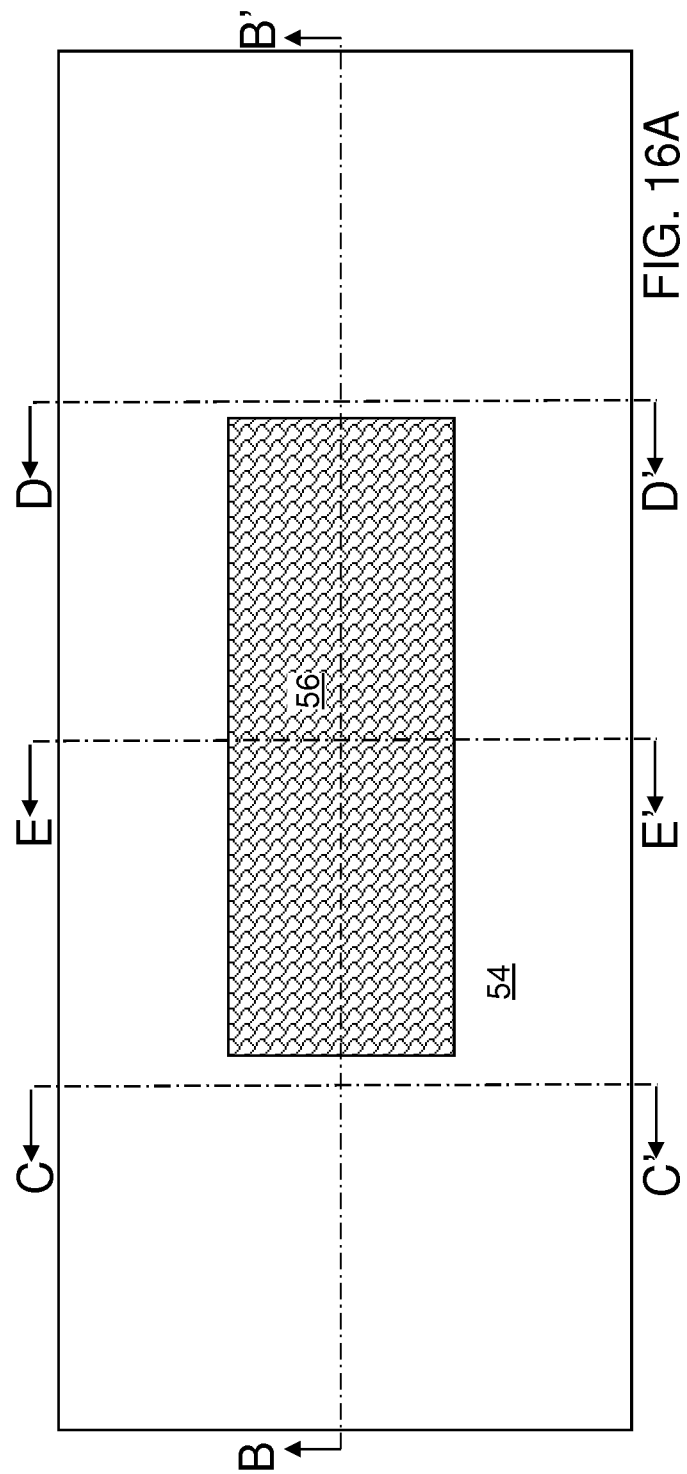

THIRD TYPE OF METAL GATE STACK FOR CMOS DEVICES

BACKGROUND

The present application relates to semiconductor structures and methods of forming the same. More particularly, the present application relates to semiconductor structures that include a third type of metal gate stack that is located above an isolation structure and between a replacement metal gate n-type field effect transistor and a replacement metal gate p-type field effect transistor. The present application also relates to methods of forming such semiconductor structures utilizing a replacement gate, i.e., gate last, processing flow.

In the production of integrated circuits on semiconductor substrates, it is often necessary to selectively interconnect various doped zones or other different regions, connections or electrodes of the devices which are formed on the semiconductor substrate. For example, in field effect technology, it is often necessary to connect selectively gate electrodes to source/drain diffusions or to connect different gate electrodes together, or to connect different source/drain regions together. In forming the devices, it is necessary to provide interconnections which connect selectively only those regions which are desired to be interconnected and to prevent connections of those regions which must be electrically isolated, and which during processing require steps or techniques which assure that they will not be interconnected.

The interconnection between the various zones or regions is desirably done by a material which has a very high conductivity (i.e., a very low resistance). Thus, the interconnection should be done with materials that have very low resistivity so that minimal amounts of material can be used to provide the desired interconnection, and yet with these materials, the interconnections must be reliably made without shorting to undesired regions or without resulting opens or regions of high resistance within the interconnect lines or at the connections of the interconnect lines to the various regions.

SUMMARY

A third type of metal gate stack is provided above an isolation structure and between a replacement metal gate n-type field effect transistor including a first metal gate stack and a replacement metal gate p-type field effect transistor including a second metal gate stack. In some embodiments of the present application, the third type of metal gate stack can be used as a low resistance wiring structure for locally connecting the replacement metal gate n-type field effect transistor to the replacement metal gate p-type field effect transistor. In other embodiments, the third type of gate stack can be used for engineering the behavior of the replacement metal gate n-type field effect transistor and/or the replacement metal gate p-type field effect transistor. In yet other embodiments, the third type of metal gate stack can be used to reduce gate height and hence parasitic capacitance of the device.

The third type of metal gate stack of the present application includes at least three different components. Notably, the third type of metal gate stack includes, as a first component, an n-type workfunction metal layer, as a second component, a p-type workfunction metal layer, and as a third component, a low resistance metal layer. In some embodiments, the uppermost surface of the first, second and third components of the third type of metal gate stack are all substantially coplanar with each other. In other embodiments, an uppermost surface of the third component of the third type of metal gate stack is non-substantially coplanar with an uppermost surface of both the first and second components of the third type of metal gate stack.

In one aspect of the present application, a semiconductor structure is provided that includes a third type of metal gate stack that is located above an isolation structure and between a replacement metal gate n-type field effect transistor and a replacement metal gate p-type field effect transistor; the third gate structure connects the replacement metal gate n-type field effect transistor and the replacement metal gate p-type field effect transistor. In one embodiment of the present application, the semiconductor structure includes a first conductivity-type field effect transistor including a first type of metal gate stack located above a first semiconductor material layer portion of a substrate and a second conductivity-type field effect transistor including a second type of metal gate stack located above a second semiconductor material layer portion of the substrate, wherein the second conductivity type is of a different conductivity type than the first conductivity type. The structure further includes a third type of metal gate stack located above a trench isolation structure that is positioned between the first semiconductor material layer portion and the second semiconductor material layer portion. The third type of metal gate stack includes a portion of a first workfunction material layer of the first conductivity-type field effect transistor, a portion of a second workfunction material layer of the second conductivity-type field effect transistor, and a low resistance metal layer.

In another embodiment of the present application, the semiconductor structure includes a first conductivity-type field effect transistor including a first type of metal gate stack located above a first semiconductor material layer portion of a substrate and a second conductivity-type field effect transistor including a second type of metal gate stack located above a second semiconductor material layer portion of the substrate, wherein the second conductivity type is of a different conductivity type than the first conductivity type. The structure further includes a third type of metal gate stack located above a trench isolation structure that is positioned between the first semiconductor material layer portion and the second semiconductor material layer portion. In this embodiment, the third type of metal gate stack includes a first material stack comprising, from bottom to top, a portion of a first workfunction material layer of the first conductivity-type field effect transistor, and a portion of a first metal layer of the first conductivity-type field effect transistor, a second material stack comprising, from bottom to top, a portion of a second workfunction material layer of the second conductivity-type field effect transistor and a portion of a second metal layer of the second conductivity-type field effect transistor, wherein the first material stack and the second material stack are spaced apart by a dielectric fill material, and a low resistance metal region located above the dielectric fill material, the first material stack and the second material stack.

In another aspect of the present application, methods are provided for forming a third type of metal gate stack above a trench isolation structure and between a replacement metal gate n-type field effect transistor including a first metal gate stack to a replacement metal gate p-type field effect transistor including a second metal gate stack that separates the two different conductivity types of transistors. In one embodiment of the present application, the method includes providing a semiconductor substrate having a first semiconductor material layer portion and a second semiconductor material layer portion separated by a trench isolation structure. Next, a sacrificial gate structure is formed on an uppermost surface of each of the first semiconductor material layer portion, the second semiconductor material layer portion, and the trench isolation structure. A dielectric material is then provided adjacent the sacrificial gate structure, wherein the dielectric material has an uppermost surface that is substantially coplanar with an uppermost surface of the sacrificial gate structure. The sacrificial gate structure is then removed to provide a gate cavity that exposes portions of the first and second semiconductor material layer portions and the trench isolation structure. Next, a gate dielectric material layer is formed along vertical sidewalls and a bottom wall of the gate cavity. After forming the gate dielectric material layer, a first workfunction metal layer is formed on a portion of an uppermost surface of the gate dielectric material layer and above the first semiconductor material layer portion and a portion of the trench isolation structure, and a second workfunction metal layer that is of a different conductivity type than the first workfunction metal layer is formed on another portion of the uppermost surface of the gate dielectric material layer and above the second semiconductor material layer portion and another portion of the trench isolation structure. A remaining portion of the gate cavity is then filled with a low resistance metal layer.

In another embodiment, the method can include providing a semiconductor substrate having a first semiconductor material layer portion and a second semiconductor material layer portion separated by a trench isolation structure. Next, a sacrificial gate structure is formed on an uppermost surface of each of the first semiconductor material layer portion, the second semiconductor material layer portion, and the trench isolation structure. A dielectric material is then provided adjacent the sacrificial gate structure, wherein the dielectric material has an uppermost surface that is substantially coplanar with an uppermost surface of the sacrificial gate structure. The sacrificial gate structure is then removed to provide a gate cavity that exposes portions of the first and second semiconductor material layer portions and the trench isolation structure. A first material stack comprising, from bottom to top, a first gate dielectric material portion, a first workfunction metal layer and a first metal layer is provided above the first semiconductor material layer portion and a portion of the trench isolation structure. A second material stack comprising, from bottom to top, a second gate dielectric material layer portion, a second workfunction metal layer that is of a different conductivity type than the first workfunction metal layer and a second metal layer that is different from the first metal layer is provided above the second semiconductor material layer portion and another portion of the trench isolation structure. Next, a remaining portion of the gate cavity is filled with a dielectric fill material and thereafter a low resistance metal region is formed atop each of the dielectric fill material, the first material stack and the second material stack.

BRIEF DESCRIPTION OF SEVERAL VIEWS OF THE DRAWINGS

FIG. 1A is a top-down view of a first exemplary semiconductor structure including, a semiconductor structure including a first semiconductor material layer portion and a second semiconductor material layer portion separated by a trench isolation structure according to a first embodiment of the present application.

FIG. 1B is a vertical cross sectional view of the first exemplary semiconductor structure of FIG. 1A along the vertical plane B-B'.

FIG. 2A is a top-down view of the first exemplary semiconductor structure of FIG. 1A after formation of a sacrificial gate structure, a dielectric spacer, source regions and drain regions.

FIG. 2B is a vertical cross-sectional view of the first exemplary semiconductor structure of FIG. 2A along the vertical plane B-B'.

FIG. 3A is a top-down view of the first exemplary semiconductor structure of FIG. 2A after formation of a dielectric material and removing the sacrificial gate structure to form a gate cavity.

FIG. 3B is vertical cross-sectional view of the first exemplary semiconductor structure of FIG. 3A along the vertical plane B-B'.

FIG. 4A is a top-down view of the first exemplary semiconductor structure of FIG. 3A after formation of a gate dielectric material layer and a first workfunction metal layer.

FIG. 4B is a vertical cross-sectional view of the first exemplary semiconductor structure of FIG. 4A along the vertical plane B-B'.

FIG. 4C is a vertical cross-sectional view of the first exemplary semiconductor structure of FIG. 4A along the vertical plane C-C'.

FIG. 4D is a vertical cross-sectional view of the first exemplary semiconductor structure of FIG. 4A along the vertical plane D-D'.

FIG. 4E is a vertical cross-sectional view of the first exemplary semiconductor structure of FIG. 4A along the vertical plane E-E'.

FIG. 5A is a top-down view of the first exemplary semiconductor structure of FIG. 4A after removal of the first workfunction metal layer from above the second semiconductor material layer portion of the semiconductor substrate.

FIG. 5B is a vertical cross-sectional view of the first exemplary semiconductor structure of FIG. 5A along the vertical plane B-B'.

FIG. 6A is a top-down view of the first exemplary semiconductor structure of FIG. 5A after formation of a second workfunction metal layer.

FIG. 6B is a vertical cross-sectional view of the first exemplary semiconductor structure of FIG. 6A along the vertical plane B-B'.

FIG. 7A is a top-down view of the first exemplary semiconductor structure of FIG. 6A after removal of the second workfunction metal layer from above the first semiconductor material layer portion of the semiconductor substrate.

FIG. 7B is a vertical cross-sectional view of the first exemplary semiconductor structure of FIG. 7A along the vertical plane B-B'.

FIG. 7C is a vertical cross-sectional view of the first exemplary semiconductor structure of FIG. 7A along the vertical plane C-C'.

FIG. 7D is a vertical cross-sectional view of the first exemplary semiconductor structure of FIG. 7A along the vertical plane D-D'.

FIG. 7E is a vertical cross-sectional view of the first exemplary semiconductor structure of FIG. 7A along the vertical plane E-E'.

FIG. 8A is a top-down view of the first exemplary semiconductor structure of FIG. 7A after formation of a low resistance metal layer and planarizartion.

FIG. 8B is a vertical cross-sectional view of the first exemplary semiconductor structure of FIG. 8A along the vertical plane B-B'.

FIG. 9A is a top-down view of the first exemplary semiconductor structure of FIG. 4A after formation of a first gate metal layer on the first workfunction metal layer and patterning in accordance with a second embodiment of the present application.

FIG. 9B is a vertical cross-sectional view of the first exemplary semiconductor structure of FIG. 9A along the vertical plane B-B'.

FIG. 9C is a vertical cross-sectional view of the first exemplary semiconductor structure of FIG. 9A along the vertical plane C-C'.

FIG. 9D is a vertical cross-sectional view of the first exemplary semiconductor structure of FIG. 9A along the vertical plane D-D'.

FIG. 9E is a vertical cross-sectional view of the first exemplary semiconductor structure of FIG. 9A along the vertical plane E-E'.

FIG. 10A is a top-down view of the first exemplary semiconductor structure of FIG. 9A after formation of a second workfunction metal layer and a second gate metal layer and patterning.

FIG. 10B is a vertical cross-sectional view of the first exemplary semiconductor structure of FIG. 10A along the vertical plane B-B'.

FIG. 11A is a top-down view of the first exemplary semiconductor structure of FIG. 10A after formation of a low resistance metal layer and planarization.

FIG. 11B is a vertical cross-sectional view of the first exemplary semiconductor structure of FIG. 11A along the vertical plane B-B'.

FIG. 12A is a top-down view of a second exemplary semiconductor structure including a first semiconductor material layer portion and a second semiconductor material layer portion separated by a trench isolation structure and a buried wire structure according to a third embodiment of the present application.

FIG. 12B is a vertical cross sectional view of the first exemplary semiconductor structure of FIG. 12A along the vertical plane B-B'.

FIG. 13A is a top-down view of the second exemplary semiconductor structure of FIG. 12A after formation of a first material stack comprising a first gate dielectric material layer portion, a first workfunction metal layer and a first metal layer and a second material stack comprising a second gate dielectric material layer portion, a second workfunction metal layer and a second metal layer within a gate cavity provided above and between the first semiconductor material layer portion and the second semiconductor material layer portion.

FIG. 13B is a vertical cross sectional view of the second exemplary semiconductor structure of FIG. 13A along the vertical plane B-B'.

FIG. 14A is a top-down view of the second exemplary semiconductor structure of FIG. 13A after formation of a low resistance metal layer between the first material stack and the second material stack and above and in direct contact with a portion of the buried wire structure.

FIG. 14B is a vertical cross sectional view of the second exemplary semiconductor structure of FIG. 14A along the vertical plane B-B'.

FIG. 16A is a top-down view of the first exemplary semiconductor structure of FIG. 15A after formation of a structure including a second dielectric material having a low resistance metal region embedded therein atop a portion of both the first material stack and the second material stack.

DETAILED DESCRIPTION

Figure 1C:
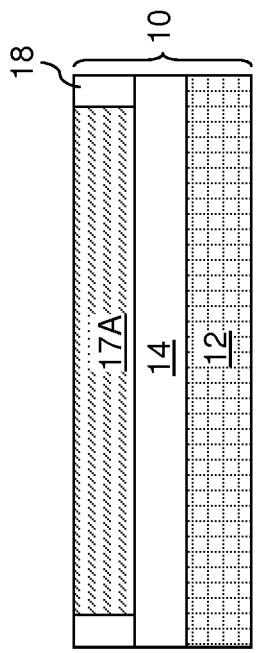
FIG. 1C is a vertical cross sectional view of the first exemplary semiconductor structure of FIG. 1A along the vertical plane C-C'.
Figure 1D:
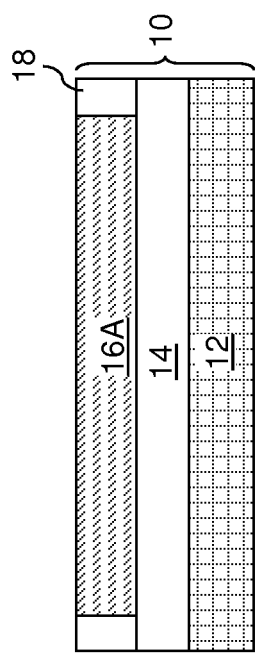
FIG. 1D is a vertical cross sectional view of the first exemplary semiconductor structure of FIG. 1A along the vertical plane D-D'.
Figure 1E:
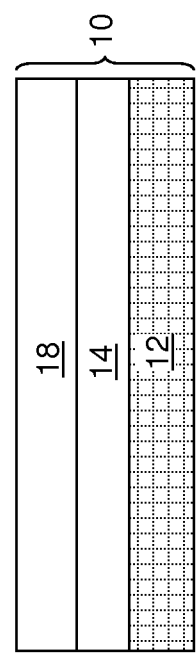
FIG. 1E is a vertical cross-sectional view of the first exemplary semiconductor structure of FIG. 1A along the vertical plane E-E'.
Figure 2D:
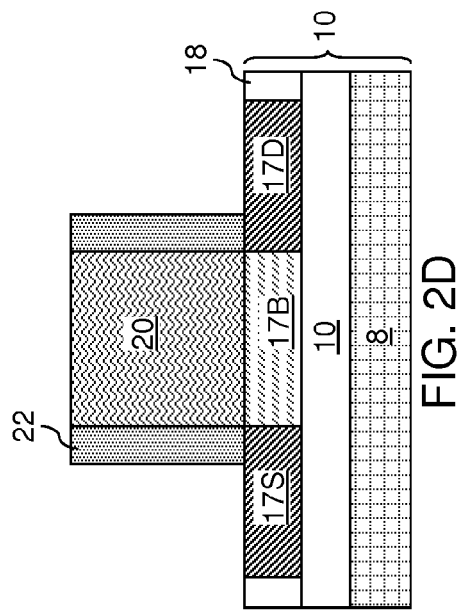
FIG. 2D is a vertical cross-sectional view of the first exemplary semiconductor structure of FIG. 2A along the vertical plane D-D'.
Figure 2C:
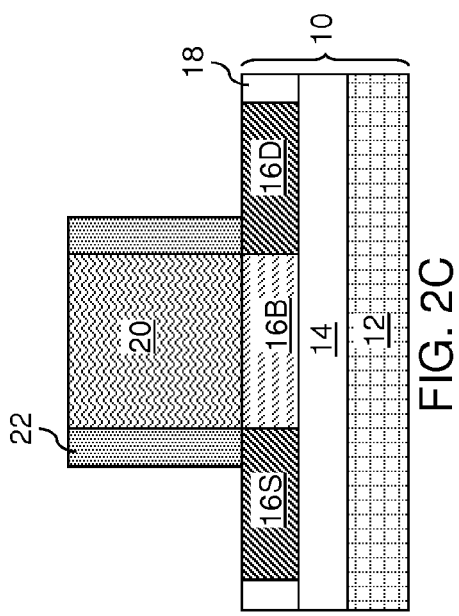
FIG. 2C is a vertical cross-sectional view of the first exemplary semiconductor structure of FIG. 2A along the vertical plane C-C'.
Figure 2E:
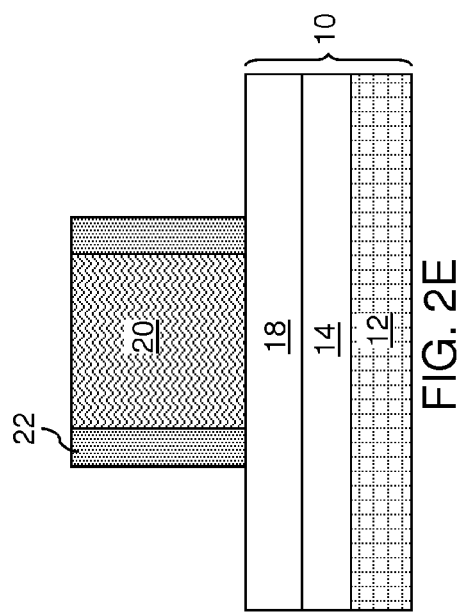
FIG. 2E is a vertical cross-sectional view of the first exemplary semiconductor structure of FIG. 2A along the vertical plane E-E'.
Figure 3D:
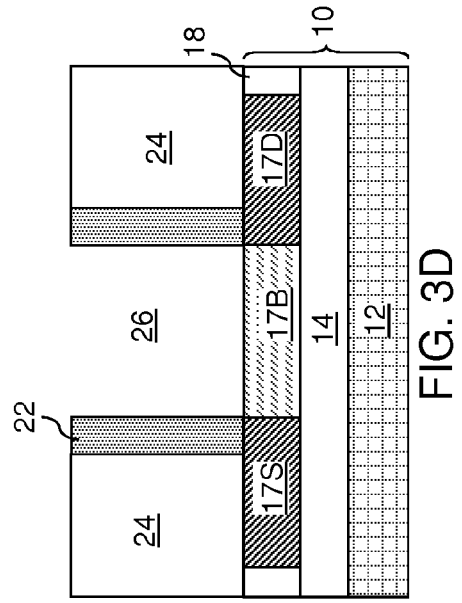
FIG. 3D is a vertical cross-sectional view of the first exemplary semiconductor structure of FIG. 3A along the vertical plane D-D'.
Figure 3C:
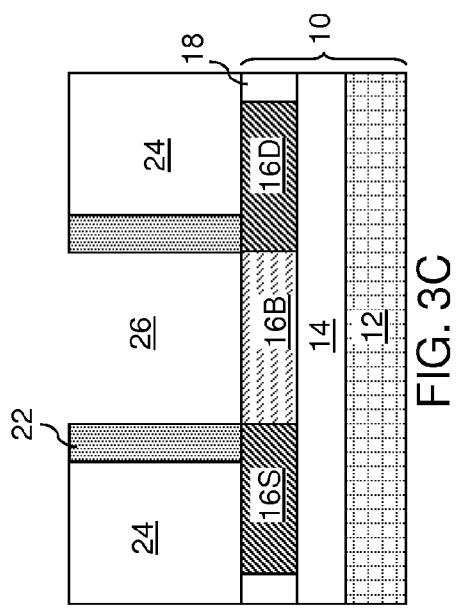
FIG. 3C is a vertical cross-sectional view of the first exemplary semiconductor structure of FIG. 3A along the vertical plane C-C'.
Figure 3E:
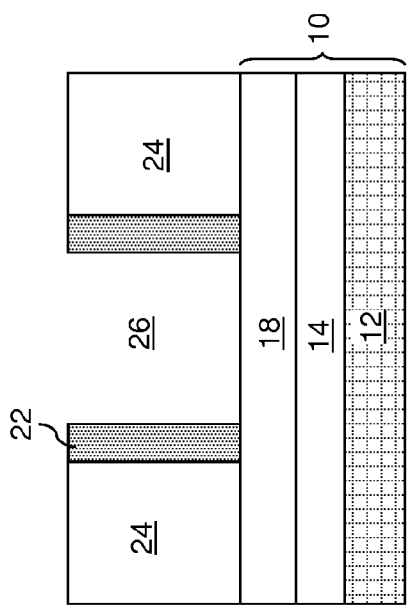
FIG. 3E is a vertical cross-sectional view of the first exemplary semiconductor structure of FIG. 3A along the vertical plane E-E'.
Figure 5D:
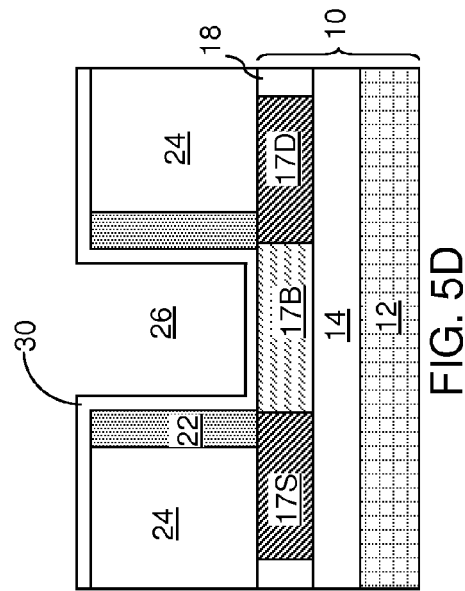
FIG. 5D is a vertical cross-sectional view of the first exemplary semiconductor structure of FIG. 5A along the vertical plane D-D'.
Figure 5C:
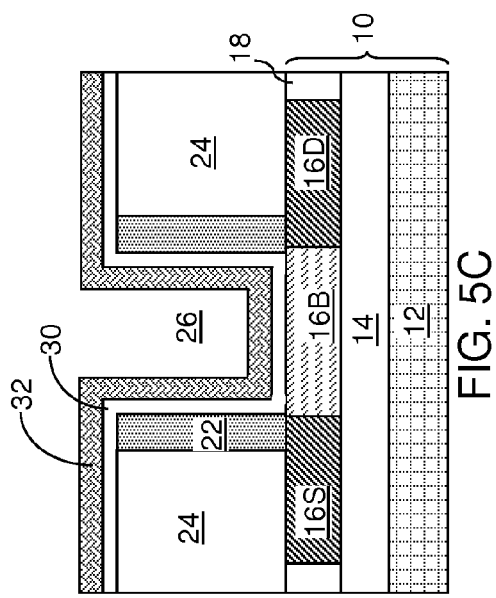
FIG. 5C is a vertical cross-sectional view of the first exemplary semiconductor structure of FIG. 5A along the vertical plane C-C'.
Figure 5E:
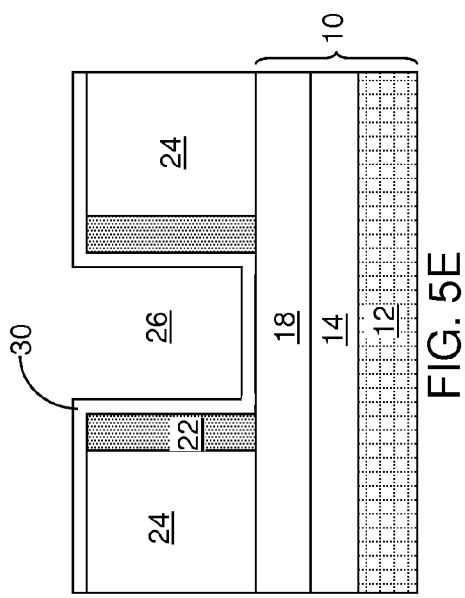
FIG. 5E is a vertical cross-sectional view of the first exemplary semiconductor structure of FIG. 5A along the vertical plane E-E'.
Figure 6D:
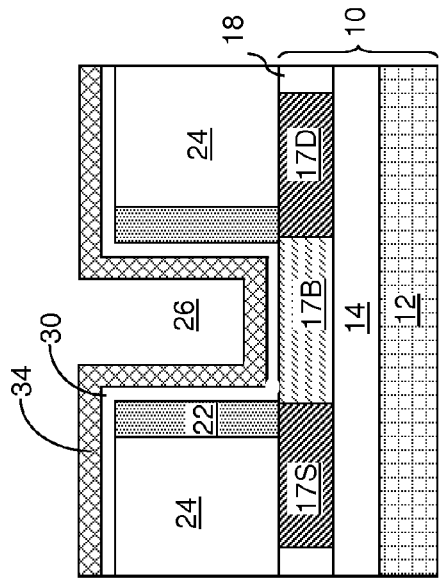
FIG. 6D is a vertical cross-sectional view of the first exemplary semiconductor structure of FIG. 6A along the vertical plane D-D'.
Figure 6C:
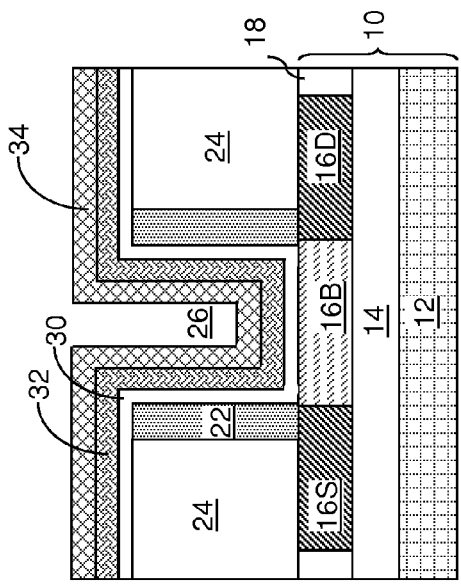
FIG. 6C is a vertical cross-sectional view of the first exemplary semiconductor structure of FIG. 6A along the vertical plane C-C'.
Figure 6E:
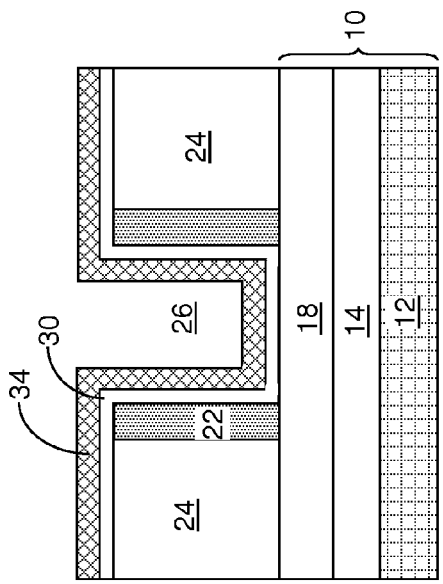
FIG. 6E is a vertical cross-sectional view of the first exemplary semiconductor structure of FIG. 6A along the vertical plane E-E'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals with the drawings and various embodiments of the present application.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As stated above, a third type of metal gate stack is provided above an isolation structure and between a replacement metal gate n-type field effect transistor including a first metal gate stack and a replacement metal gate p-type field effect transistor including a second metal gate stack. In some embodiments of the present application, the third type of metal gate stack can be used as a low resistance wiring structure for locally connecting the replacement metal gate n-type field effect transistor to the replacement metal gate p-type field effect transistor. In other embodiments, the third type of gate stack can be used for engineering the behavior of the replacement metal gate n-type field effect transistor and/or the replacement metal gate p-type field effect transistor. In yet other embodiments, the third type of metal gat stack can be used to reduce gate height and hence parasitic capacitance of the device.

The third type of metal gate stack of the present application includes at least three different components. Notably, the third type of metal gate stack includes, as a first component, an n-type workfunction metal layer, as a second component, a p-type workfunction metal layer, and as a third component, a low resistance metal layer. In some embodiments, the uppermost surface of the first, second and third components of the third type of metal gate stack are all substantially coplanar with each other. In other embodiments, an uppermost surface of the third component of the third type of metal gate stack is non-substantially coplanar with an uppermost surface of both the first and second components of the third type of metal gate stack.

Referring first to FIGS. 1A-1E, there are illustrated various views of a first exemplary semiconductor structure including, a semiconductor substrate 10 including a first semiconductor material layer portion 16A and a second semiconductor material layer portion 17A separated by a trench isolation structure 18 according to a first embodiment of the present application. Although a single first semiconductor material layer portion 16A and a single second semiconductor material layer portion 17A are described and illustrated, a plurality of first semiconductor material layer portions 16A and a plurality of second semiconductor material layer portions 17A can be present within the semiconductor substrate 10 that can be used in the present application.

The first semiconductor material layer portion 16A can also be referred to as a first active device region in which a first conductivity type semiconductor device can be subsequently formed thereon. Likewise, the second semiconductor material layer portion 17A can also be referred to as a second active device region in which a second conductivity type semiconductor device that is opposite to the first conductivity type semiconductor device can be subsequently formed thereon.

The structure shown in FIGS. 1A-1E can be formed by first providing a semiconductor substrate 10. In one embodiment of the present application, the semiconductor substrate 10 is a semiconductor on insulator (SOI) substrate that includes from bottom to top, a handle substrate 12, an insulator layer 14 and a semiconductor material layer which is subsequently processed into the first and second semiconductor material layer portions 16A and 17A. The semiconductor material layer that is subsequently processed into the first and second semiconductor material layer portions 16A and 17A is present on an uppermost surface of the insulator layer 14. The insulator layer 14 is present on an uppermost surface of the handle substrate 12. The handle substrate 12 provides mechanical support to the insulator layer 14 and the semiconductor material layer. In the particular embodiment illustrated, the first and second semiconductor material layer portions 16A and 17A are used as active regions in forming a planar semiconductor device. In other embodiments (not shown), but within the scope of the present application, the semiconductor material layer that provides the first and second semiconductor material portions 16A and 17A can be processed utilizing conventional techniques well known to those skilled in the art into fin structures and/or semiconductor nanowires.

Although the present application is described and illustrated utilizing an SOI substrate, other semiconductor substrates can also be used including, for example, a semiconductor substrate in which handle substrate 12 is omitted, or a bulk semiconductor substrate in which the entirety of the semiconductor substrate 10 is comprised of a semiconductor material.

In some embodiments of the present application, the handle substrate 12 and the semiconductor material layer that is used in providing the first and second semiconductor material layer portions 16A and 17A may comprise a same semiconductor material. In other embodiments of the present application, the handle substrate 12 and the semiconductor material layer that is used in providing the first and second semiconductor material layer portions 16A and 17A may comprise a different semiconductor material. The term "semiconductor" as used herein in connection with the semiconductor material of the handle substrate 12 and the semiconductor material layer that is used in providing the first and second semiconductor material layer portions 16A and 17A denotes any semiconductor material including, for example, Si, Ge, SiGe, SiC, SiGeC, and III/V compound semiconductors such as, for example, InAs, GaAs, and InP. Multilayers of these semiconductor materials can also be used as the semiconductor material of the handle substrate 12 and the semiconductor material layer that is used in providing the first and second semiconductor material layer portions 16A and 17A. In one embodiment, the handle substrate 12 and the semiconductor material layer that is used in providing the first and second semiconductor material layer portions 16A and 17A are both comprised of silicon. In some embodiments, the handle substrate 12 is a non-semiconductor material including, for example, a dielectric material and/or a conductive material.

The handle substrate 12 and the semiconductor material layer that is used in providing the first and second semiconductor material layer portions 16A and 17A may have the same or different crystal orientation. For example, the crystal orientation of the handle substrate 12 and/or the semiconductor material layer that is used in providing the first and second semiconductor material layer portions 16A and 17A may be {100}, {110}, or {111}. Other crystallographic orientations besides those specifically mentioned can also be used in the present application. The handle substrate 12 and/or the semiconductor material layer that is used in providing the first and second semiconductor material layer portions 16A and 17A may be a single crystalline semiconductor material, a polycrystalline material, or an amorphous material. Typically, at least the semiconductor material layer that is used in providing the first and second semiconductor material layer portions 16A and 17A is a single crystalline semiconductor material. In some embodiments, the semiconductor material layer that is used in providing the first and second semiconductor material layer portions 16A and 17A and that is located atop the insulator layer 14 can be processed to include semiconductor material layer portions having different crystal orientations.

The insulator layer 14 of the SOI substrate may be a crystalline or non-crystalline oxide or nitride. In one embodiment, the insulator layer 14 is an oxide such as, for example, silicon dioxide. The insulator layer 14 may be continuous or it may be discontinuous. When a discontinuous insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor material layer to a layer having a thickness that is more desirable.

The thickness of semiconductor material layer that is used in providing the first and second semiconductor material layer portions 16A and 17A is typically from 10 nm to 100 nm, with a thickness from 50 nm to 70 nm being more typical. In some embodiments, and when an ETSOI (extremely thin semiconductor-on-insulator) substrate is employed, the semiconductor material layer that is used in providing the first and second semiconductor material layer portions 16A and 17A can have a thickness of less than 10 nm. If the thickness of the semiconductor material layer that is used in providing the first and second semiconductor material layer portions 16A and 17A is not within one of the above mentioned ranges, a thinning step such as, for example, planarization or etching can be used to reduce the thickness of semiconductor material layer that is used in providing the first and second semiconductor material layer portions 16A and 17A to a value within one of the ranges mentioned above. The insulator layer 14 of the SOI substrate typically has a thickness from 1 nm to 200 nm, with a thickness from 100 nm to 150 nm being more typical. The thickness of the handle substrate 12 of the SOI substrate is inconsequential to the present application.

The semiconductor material layer that is used in providing the first and second semiconductor material layer portions 16A and 17A may be doped, undoped or contain doped and undoped regions therein. For clarity, the doped regions are not specifically shown in the drawings of the present application. Each doped region within the semiconductor material layer that is used in providing the first and second semiconductor material layer portions 16A and 17A may have the same, or they may have different conductivities and/or doping concentrations. The doped regions that are present in the semiconductor material layer that is used in providing the first and second semiconductor material layer portions 16A and 17A can be formed by ion implantation process or gas phase doping.

After providing the semiconductor substrate 10, a trench isolation structure 18 can be formed into the semiconductor material layer of the SOI substrate providing the first and second semiconductor material layer portions 16A and 17A. The trench isolation structure 18 surrounds each of the first and second semiconductor material layer portions 16A and 17A. In some embodiments, and as illustrated in the drawings, a bottommost surface of the trench isolation structure 18 directly contacts an uppermost surface of the insulator layer 14. The trench isolation structure 18 can be formed utilizing a conventional trench isolation process well known to those skilled in the art. For example, lithography, etching and filling of the trench with a trench dielectric such as an oxide may be used in forming the trench isolation structure. Optionally, a liner may be formed in the trench prior to trench fill, a densification step may be performed after the trench fill and a planarization process may follow the trench fill as well.

The trench isolation structure 18 may provide isolation between neighboring gate structures, typically required when the neighboring gate structures have opposite conductivities, i.e., n-type transistors and p-type transistors. As such, the trench isolation structure 18 can separate a first device region represented by the first semiconductor material layer portion 16A in which an n-type or p-type transistor can be subsequently formed and a second device region represented by the second semiconductor material layer portion 17A in which the other of the n-type or p-type transistor not previously formed into the first device region can be formed.

Referring now to FIGS. 2A-2E, there are illustrated the first exemplary semiconductor structure of FIGS. 1A-1E after formation of a sacrificial gate structure 20, a dielectric spacer 22, source regions 16S, 17S and drain regions 16D, 17D.

The sacrificial gate structure 20 is a contiguous layer that is formed on an uppermost surface of each of the first semiconductor material layer portion 16A, the trench isolation structure 18, and the second semiconductor material layer portion 17A. In some embodiments (and as shown), the sacrificial gate structure comprises only a single sacrificial material, i.e., a sacrificial gate material as described below. In other embodiments (not shown), the sacrificial gate structure may include a sacrificial gate dielectric material, e.g., silicon oxide, and a sacrificial gate material. In such an embodiment, the sacrificial gate dielectric material is located directly beneath the sacrificial gate material.

The sacrificial gate structure runs perpendicularly across the first semiconductor material layer portion 16A, the trench isolation structure 18, and the second semiconductor material layer portion 17A. The term "sacrificial gate structure" is used throughout the present application to denote a material (or materials) that serves (or serve) as a placeholder structure for a functional gate structure to be subsequently formed. The term "functional gate structure" denotes a permanent gate structure used to control output current (i.e., flow of carriers in the channel) of a semiconducting device through electrical or magnetic fields. In the present application, the permanent gate structure is a replacement metal gate structure that contains at least a U-shaped gate dielectric material layer, and a U-shaped workfunction metal.

In the particular embodiment illustrated, the sacrificial gate structure 20 can be formed by first providing a blanket layer of a sacrificial gate material on the first exemplary structure shown in FIGS. 1A-1E. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu.

After providing the blanket layer of sacrificial gate material, the blanket layer of sacrificial gate material can be patterned by lithography and etching so as to form the sacrificial gate structure 20. Lithography can include forming a photoresist (not shown) on the uppermost surface of the blanket layer of sacrificial gate material, exposing the photoresist to a desired pattern of radiation, and then developing the exposed photoresist with a resist developer to provide a patterned photoresist atop the blanket layer of sacrificial gate material. An etch is then employed which transfers the pattern from the patterned photoresist into the blanket layer of sacrificial gate material. In one embodiment, the etch used for pattern transfer may include a dry etch process such as, for example, reactive ion etching, plasma etching, ion beam etching or laser ablation. After transferring the pattern into the material layers, the patterned photoresist can be removed utilizing a resist stripping process such as, for example, ashing.

After forming the sacrificial gate structure 20, a dielectric spacer 22 is formed on each vertical sidewall of the sacrificial gate structure 20. The dielectric spacer 22 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the dielectric spacer 22 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

After providing the dielectric spacer 22, a source region (16S and 17S) is formed into an exposed portion of the first and second semiconductor material layer portions 16A, 17A that is not covered by the dielectric spacer 22 and the sacrificial gate structure 20 and that is located on one side of the sacrificial gate structure 20. A drain region (16D and 17D) is also formed into an exposed portion of the first and second semiconductor material layer portions 16A, 17A that is not covered by the dielectric spacer 22 and sacrificial gate structure 20 and located on another side of the sacrificial gate structure 20. A remaining portion of the first semiconductor material layer portion 16A that does not contain the source region 16S or the drain region 16D can be referred to as a first semiconductor material body portion (i.e., first device channel region) 16B. A remaining portion of the second semiconductor material layer portion 17A that does not contain the source region 17S or the drain region 17D can be referred to as a second semiconductor material body portion (i.e., second device channel region) 17B. In some embodiments, a source extension region and drain extension region (not separately shown) are typically formed prior to forming the dielectric spacer 22 utilizing an extension ion implantation process. As such, a portion of each of the source extension region and drain extension region would be located beneath the dielectric spacer 22. Each source region 16S, 17S and each drain region 16D, 17D are formed utilizing a source/drain ion implantation process. An activation anneal may follow the implantation processes.

Each source region 16S, 17S (including the corresponding source extension region) and each drain region 17S, 17D (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate examples of n-type dopants, i.e., impurities, include, but are not limited to, antimony, arsenic and phosphorous. The concentration of dopants within each source region 16S, 17S (and corresponding source extension region) and each drain region 16D, 17D (and the corresponding drain extension region) can be within ranges typically used in forming metal oxide semiconductor field effect transistors (MOSFETs).

Referring now to FIGS. 3A-3E, there are illustrated the first exemplary semiconductor structure of FIGS. 2A-2E after formation of a dielectric layer 24 and removal of the sacrificial gate structure 20 to form a gate cavity 26. The gate cavity 26 has a volume that is the same as the volume of the previously provided sacrificial gate structure 20.

After forming the dielectric material 24 and prior to removing the sacrificial gate structure 20 shown in the drawings, the dielectric material 24 has an uppermost surface that is substantially coplanar with an uppermost surface of the sacrificial gate structure 24 and the dielectric spacer 22. The term "substantially coplanar" as used throughout the present application denotes that an upper surface of one material layer is within ±10 nm from an upper surface of another material layer. As such, the uppermost surface of the sacrificial gate structure 20 is exposed after forming the dielectric material 24. A vertical sidewall of the dielectric layer 24 contacts a vertical sidewall of the dielectric spacer, while a bottommost surface of the dielectric material 24 contacts an uppermost surface of the trench isolation structure 18.

In some embodiments, the dielectric material 24 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK can be used as the dielectric material 24. The use of a self-planarizing dielectric material as dielectric material 24 may avoid the need to perform a subsequent planarizing step.

In one embodiment, the dielectric material 24 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 24, a planarization process or an etch back process follows the deposition of the dielectric material. The thickness of the dielectric material 24 that can be employed in the present application may vary depending on the type of dielectric material employed as well as the method that was employed in forming the same. In one embodiment, the dielectric material 24 has a thickness from 80 nm to 500 nm. Other thicknesses that are greater or lesser than the range provided above can also be used for the dielectric material 24.

After dielectric material 24 formation, the gate cavity 26 can be formed by removing the sacrificial gate structure 20. In some embodiments (and as shown), the entirety of the sacrificial gate structure 20 (including the sacrificial gate material and, if present, the sacrificial gate dielectric) is removed. In other embodiments (not shown), the sacrificial gate material of the sacrificial gate structure is removed, while maintaining the sacrificial gate dielectric material. The sacrificial gate structure 20 can be removed by etching. In one example, a reactive ion etch can be used to remove the sacrificial gate structure 20. As shown, the gate cavity 26 exposes sidewalls of dielectric spacer 22 and an entirety of an uppermost surface of each semiconductor material body portion 16B, 17B, an entirety of an uppermost surface of the trench isolation structure 18 that is located between the first and second semiconductor material body portions 16B, 17B and some portions of the uppermost surface of the trench isolation structures 18 not located between the first and second semiconductor material body portions 16B, 17B.

Referring now to FIGS. 4A-4E, there are illustrated the first exemplary semiconductor structure of FIGS. 3A-3E after formation of a gate dielectric material layer 30 and a first workfunction metal layer 32. As is shown, the gate dielectric material layer 30 and the first workfunction metal layer 32 are each contiguous layers that are formed on the exposed uppermost surface of the dielectric material 24, dielectric spacers 22 and within the gate cavity 26. Within the gate cavity 26, the gate dielectric material layer 30 and the first workfunction metal layer 32 are present along the vertical sidewalls and bottom wall portion of the gate cavity 26. Along the bottom wall portion of the gate cavity 26, the gate dielectric material layer 30 and the first workfunction metal layer 32 are present on an entirety of the exposed upper surface of each of the first and second semiconductor material body portions 16B, 17B and the trench isolation structure 18 that is present between the first and second semiconductor material body portions 16B, 17B.

The gate dielectric material layer 30 that can be used in the present application can be a semiconductor oxide, a semiconductor nitride, and/or a semiconductor oxynitride. In one example, the gate dielectric material layer 30 can be composed of silicon dioxide, silicon nitride and/or silicon oxynitride. In another embodiment of the present application, the gate dielectric material layer 30 may include at least a dielectric metal oxide. Exemplary dielectric metal oxides that can be used as gate dielectric material layer 30 include, but are not limited to, $HfO_2$, $ZrO_2$, $La_2O_3$, $Al_2O_3$, $TiO_2$, $SrTiO_3$, $LaAkO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a dielectric metal oxide can be formed and used as the gate dielectric material layer 30.

In some embodiments of the present application, the gate dielectric material layer 30 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material layer 30 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material layer 30 can have a thickness in a range from 1 nm to 10 nm. Other thicknesses that are lesser than or greater than the aforementioned thickness range can also be employed for the gate dielectric material layer 30.

Next, a first workfunction metal layer 32 is formed on the entire uppermost surface of the gate dielectric material layer 30. The first workfunction metal layer 32 may consist of a p-type metal or an n-type metal, depending on whether the transistor to be subsequently formed on the first semiconductor material body portion 16B is a p-type FET or an n-type FET. In some embodiments in which an n-type FET is being formed on the first semiconductor material body portion 16B, the first workfunction metal layer 32 will be an n-type workfunction material layer. Examples of n-type workfunction metal layers that can be employed as the first workfunction metal layer 32 include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide, or metal nitrides that include these elements. An n-type workfunction metal layer will enable the formation of an n-type FET gate electrode with a workfunction that is between 3.9 eV and 4.5 eV.

In some embodiments in which a p-type FET transistor is to be subsequently formed on the first semiconductor material body portion 16B, the first workfunction metal layer 32 will be a p-type workfunction material layer. Examples of p-type workfunction metal layers that can be employed as the first workfunction metal layer 32 include, but are not limited to, ruthenium, palladium, platinum, cobalt, nickel, and conductive metal oxides, e.g., ruthenium oxide. A p-type workfunction metal layer will enable the formation of a p-type FET gate electrode with a workfunction that is between 4.5 eV and 5.2 eV.

The first workfunction metal layer 32 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the first workfunction metal layer 32 has a thickness from 1 nm to 100 nm. Other thicknesses that are lesser than or greater than the aforementioned thickness range can also be employed for the first workfunction metal layer 32.

Referring now to FIGS. 5A-5E, there are illustrated the first exemplary semiconductor structure of FIGS. 4A-4E after removing the first workfunction metal layer 32 from above the entirety of the second semiconductor material body portion 17B and above a portion of the trench isolation structure 18 that separates the first semiconductor material body portion 16B from the second semiconductor material body portion 17B. After removing the first workfunction metal layer 32 from above the entirety of the second semiconductor material body portion 17B and above a portion of the trench isolation structure 18 that separates from the first semiconductor material body portion 16B from the second semiconductor material body portion 17B, an underlying portion of the gate dielectric material layer 30 is exposed.

The removal of the first workfunction metal layer 32 from above the entirety of the second semiconductor material body portion 17B and above a portion of the trench isolation structure 18 that separates from the first semiconductor material body portion 16B from the second semiconductor material body portion 17B can be performed by first providing a block mask (not shown) on the portion of the first workfunction metal layer 32 which is to remain in the structure. With the block mask in place, the exposed portion of the first workfunction metal layer 32 is removed utilizing an etching process that selectively removes the exposed portion of the first workfunction metal layer 32. After the etch, the block mask is removed utilizing a conventional block mask stripping process.

Referring now to FIGS. 6A-6E, there are illustrated the first exemplary semiconductor structure of FIGS. 5A-5E after formation of a second workfunction metal layer 34. The second workfunction metal layer 34 is a contiguous layer that is formed on the exposed uppermost surface of the remaining portion of the first workfunction metal layer 32 and the exposed uppermost surface of a portion of the gate dielectric material layer 30. The second workfunction metal layer 34 is a different conductivity type workfunction metal than the first workfunction metal layer 32. In one embodiment, and in which the first workfunction metal layer 32 is a p-type workfunction metal, the second workfunction metal layer 34 is an n-type workfunction metal. In another embodiment, and when the first workfunction metal layer 32 is an n-type workfunction metal, the second workfunction metal layer 34 is a p-type workfunction metal. The materials, methods of deposition and thicknesses provided above for the first workfunction metal layer 32 apply here as well for the second workfunction metal layer 34.

Referring now to FIGS. 7A-7E, there are illustrated the first exemplary semiconductor structure of FIGS. 6A-6E after removing the second workfunction metal layer 34 from above the entirety of the first semiconductor material body portion 16B and above a portion of the trench isolation structure 18 that separates from the first semiconductor material body portion 16B from the second semiconductor material body portion 17B. After removing the second workfunction metal layer 34 from above the entirety of the first semiconductor material body portion 16B and above a portion of the trench isolation structure 18 that separates from the first semiconductor material body portion 16B from the second semiconductor material body portion 17B, an underlying portion of the first workfunction metal layer 32 is exposed over the first semiconductor material body portion 16B, while a portion of the gate dielectric material layer 30 is exposed over the trench isolation structure 18 that is located between the first and second semiconductor material body portions 16B, 17B.

The removal of the second workfunction metal layer 34 from above the entirety of the first semiconductor material body portion 16B and above a portion of the trench isolation structure 18 that separates from the first semiconductor material body portion 16B from the second semiconductor material body portion 17B can be performed by first providing a block mask (not shown) on the portion of the second workfunction metal layer 34 which is to remain in the structure. With the block mask in place, the exposed portion of the second workfunction metal layer 34 is removed utilizing an etching process that selectively removes the exposed portion of the second workfunction metal layer 34. After the etch, the block mask is removed utilizing a conventional block mask stripping process.

Referring now to FIGS. 8A-8E, there is illustrated the first exemplary structure of FIGS. 7A-7E after formation of a low resistance metal layer 36 and planarization. The term "low resistance metal layer" is used throughout the present application to denote a metal that has a conductivity of $1.79 \times 10^7$ (S/m) or greater. Examples of low resistance metals that can be used as the low resistance metal layer 36 include, but are not limited, to, tungsten (w), aluminum (Al) and copper (Cu).

The low resistance metal layer 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. The low resistance metal layer 36 fills the entire remaining volume of the gate cavity 26 and extends outside the gate cavity 26 onto an uppermost surface of a remaining portion of the first workfunction metal layer 32 and a remaining portion of the second workfunction metal layer 34. In one embodiment, the low resistance metal layer 34 has a thickness after deposition, but prior to planarization of from 50 nm to 200 nm.

Following the formation of the low resistance metal layer 34, a planarization process such as chemical mechanical polishing and/or grinding can be employed to remove the low resistance metal layer 34 and the first and second workfunction metal layers 32, 34 from atop the uppermost horizontal surfaces of the dielectric spacer 22 and dielectric material 24.

Figure 8D:
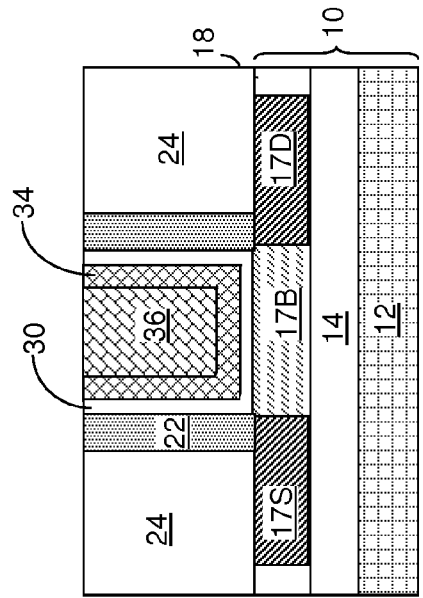
FIG. 8D is a vertical cross-sectional view of the first exemplary semiconductor structure of FIG. 8A along the vertical plane D-D'.
Figure 8C:
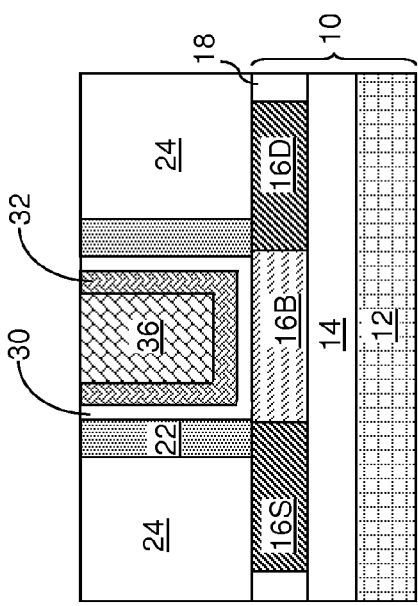
FIG. 8C is a vertical cross-sectional view of the first exemplary semiconductor structure of FIG. 8A along the vertical plane C-C'.
Figure 8E:
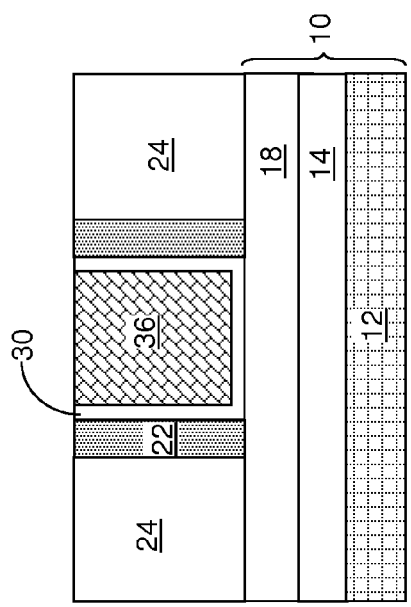
FIG. 8E is a vertical cross-sectional view of the first exemplary semiconductor structure of FIG. 8A along the vertical plane E-E'.
Figure 10C:
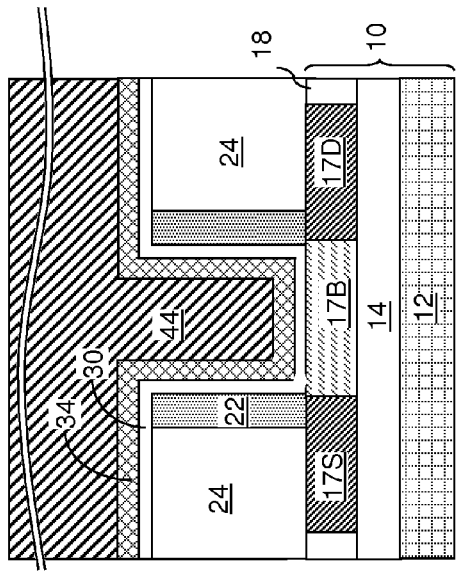
FIG. 10C is a vertical cross-sectional view of the first exemplary semiconductor structure of FIG. 10A along the vertical plane C-C'.
Figure 10D:
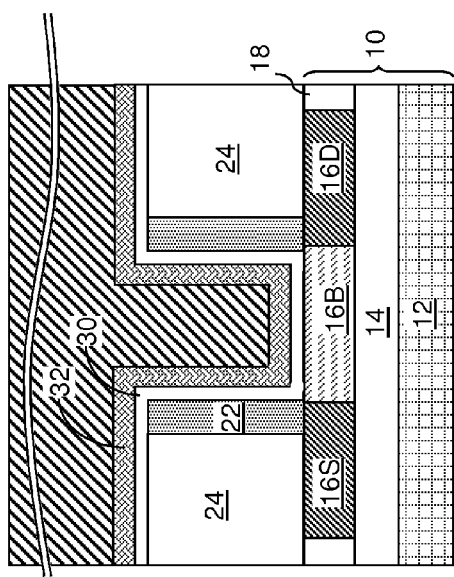
FIG. 10D is a vertical cross-sectional view of the first exemplary semiconductor structure of FIG. 10A along the vertical plane D-D'.
Figure 10E:
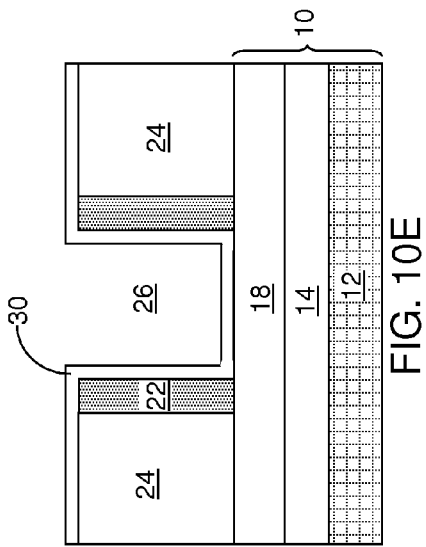
FIG. 10E is a vertical cross-sectional view of the first exemplary semiconductor structure of FIG. 10A along the vertical plane E-E'.

FIGS. 8A-8E illustrate a semiconductor structure in accordance with one embodiment of the present application. The semiconductor structure includes a first conductivity-type field effect transistor including a first type of metal gate stack (i.e., elements 30, 32 and 36 shown in FIG. 8C) located above a first semiconductor material layer portion (i.e., element 16B) of a substrate (i.e., element 10) and a second conductivity-type field effect transistor including a second type of metal gate stack (i.e., elements 30, 34 and 36 shown in FIG. 8D) located above a second semiconductor material layer portion (i.e., element 17B) of the substrate (i.e., element 10), wherein the second conductivity type is of a different conductivity type than the first conductivity type. The structure further includes a third type of metal gate stack (comprised of elements 32, 34, and 36 as shown in FIG. 8B) located above a trench isolation structure (i.e., element 18) that is positioned between the first semiconductor material layer portion (i.e., element 16B) and the second semiconductor material layer portion (i.e., element 17B). The third type of metal gate stack includes a portion of a first workfunction material layer (i.e., portion of element 32) of the first conductivity-type field effect transistor, a portion of a second workfunction material layer (i.e., a portion of element 34) of the second conductivity-type field effect transistor, and a low resistance metal layer (i.e., element 36). In this embodiment, the low resistance metal layer 36 has an uppermost surface that is substantially coplanar with an uppermost surface of each of the first and second workfunction metal layers 32, 34. Also, in this embodiment, a bottommost surface of the low resistance metal layer 36 directly contacts an uppermost surface of gate dielectric material layer 30 that is not covered by the first and second workfunction metal layers 32, 34.

Referring now to FIGS. 9A-9E, there is illustrated the first exemplary semiconductor structure of FIGS. 4A-4E after formation of a first gate metal layer 42 on the first workfunction metal layer 32 and patterning in accordance with a second embodiment of the present application. The patterning removes the first gate metal layer 42 and the first work function metal layer 32 from above the entirety of the second semiconductor material body portion 17B and above a portion of the trench isolation structure 18 that separates the first semiconductor material body portion 16B from the second semiconductor material body portion 17B. After removing first gate metal layer 42 and the first workfunction metal layer 32 from above the entirety of the second semiconductor material body portion 17B and above a portion of the trench isolation structure 18 that separates from the first semiconductor material body portion 16B from the second semiconductor material body portion 17B, an underlying portion of the gate dielectric material layer 30 is exposed.

As stated above, the semiconductor structure shown in FIGS. 9A-9E begins by first providing the semiconductor structure shown in FIGS. 4A-4E. After forming the first workfunction metal layer 32, a blanket layer of a first metal layer 42 is formed on the exposed uppermost surface of the first workfunction metal layer 32. The first metal layer 42 that is formed prior to patterning is a contiguous material. The first metal layer 42 and the first workfunction metal layer 32 collectively may be referred to herein as a first metal stack. In some embodiments of the present application, the first metal stack is an n-type FET metal stack including an n-type workfunction metal layer. In other embodiments of the present application, the first metal stack is a p-type FET metal stack including a p-type workfunction metal layer.

The first metal layer 42 can be comprised of an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), a metal semiconductor alloy (i.e., nickel silicide, cobalt silicide, and platinum silicide) or multilayered combinations thereof. The first metal layer 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal semiconductor alloy is employed as the first metal layer 42, the metal semiconductor alloy can be formed by a silicide process. In one embodiment, the first metal layer 42 has a thickness from 25 nm to 100 nm. Other thicknesses that are lesser than or greater than the aforementioned thickness range can also be employed for the first metal layer 42.

After forming the blanket layer of the first metal layer 42 on the first workfunction metal layer 32, the first metal layer 42 and the first workfunction metal layer 32 are patterned by lithography and etching to provide a first metal stack comprising a remaining portion of the first metal layer 42 and a remaining portion of the first workfunction metal layer 32 located above the entirety of the first semiconductor material body portion 16B and a portion of the trench isolation structure 18 that separates the first semiconductor material body portion 16B from the second semiconductor material body portion 17B. After patterning, no first metal layer 42 and no first workfunction metal layer 32 are located above the second semiconductor material body portion 17B. The lithography used in patterning the first metal layer 42 and the first workfunction metal layer 32 includes the same technique as mentioned above. The etching of the first metal layer 42 and the first workfunction metal layer 32 that are not protected by the patterned photoresist material may include dry etching and/or chemical wet etching. After etching, the patterned photoresist is removed to provide the structure shown in FIGS. 9A-9E.

Referring now to FIGS. 10A-10E, there are illustrated the first exemplary semiconductor structure of FIGS. 9A-9E after formation a second workfunction metal layer 34 and second gate metal layer 44 and patterning. The patterning provides a second metal gate stack comprising a remaining portion of the second metal layer 44 and a remaining portion of the second workfunction metal layer 34 located above the entirety of the second semiconductor material body portion 17B and a portion of the trench isolation structure 18 that is positioned between the first and second semiconductor material body portions 16B, 17B. After patterning, no second metal layer 44 and no second workfunction metal layer 33 are located above the first semiconductor material body portion 16B.

The second workfunction metal layer 34 that is employed in this embodiment of the present application includes one of the second workfunction metals mentioned above in connection with providing the structure shown in FIGS. 6A-6E of the present application. The second workfunction metal layer 34 that is employed in this embodiment is a contiguous layer prior to patterning and it can be formed by one of the techniques mentioned in the previous embodiment of the present application. The second workfunction metal layer 34 that is employed in this embodiment can also have a thickness within the range previously mentioned above.

After forming the second workfunction metal layer 34, the second metal layer 44 is formed. The second metal layer 44 comprises a different metal material than the first metal layer. The second metal layer 44 may comprise an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), a metal semiconductor alloy (i.e., nickel silicide, cobalt silicide, and platinum silicide) or multilayered combinations thereof. The second metal layer 44 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal semiconductor alloy is employed as the second metal layer 44, the metal semiconductor alloy can be formed by a silicide process. In one embodiment, the second metal layer 44 has a thickness from 25 nm to 100 nm. Other thicknesses that are lesser than or greater than the aforementioned thickness range can also be employed for the second metal layer 44.

The lithography used in patterning the second metal layer 44 and the second workfunction metal layer 34 includes the same technique as mentioned above. The etching of the second metal layer 44 and the second workfunction metal layer 34 that are not protected by the patterned photoresist material may include dry etching and/or chemical wet etching. After etching, the patterned photoresist is removed to provide the structure shown in FIGS. 10A-10E.

As is shown in FIGS. 10A-10E, the first metal stack comprising a remaining portion of the first workfunction metal 32 and a remaining portion of the first metal layer 42 is separated from the second metal stack comprising a remaining portion of the second workfunction metal 34 and a remaining portion of the second metal layer 44 by a remaining portion of gate cavity 26.

Referring now to FIGS. 11A-11E, there are illustrated the structure shown in FIGS. 10A-10E after formation of a low resistance metal layer 36 and planarization. The low resistance metal layer 36 used in this embodiment of the present application includes one of the materials mentioned above in providing the low resistance metal layer 36 to the previous embodiment of the present application. The low resistance metal layer 36 of this embodiment of the present application can be formed and have an as deposited thickness as mentioned in the previous embodiment of the present application. The low resistance metal layer 36 fills the entirety of the remaining portion of the gate cavity that is positioned above the trench isolation structure 18 and separated from the second metal stack comprising a remaining portion of the second workfunction metal 34 and a remaining portion of the second metal layer 44.

Following the formation of the low resistance metal layer 34, a planarization process such as chemical mechanical polishing and/or grinding can be employed to remove the low resistance metal layer and the first and second metal layers 42, 44 and the first and second workfunction metal layers 32, 34 from atop the uppermost horizontal surfaces of the dielectric spacer 22 and dielectric material 24.

Figure 11C:
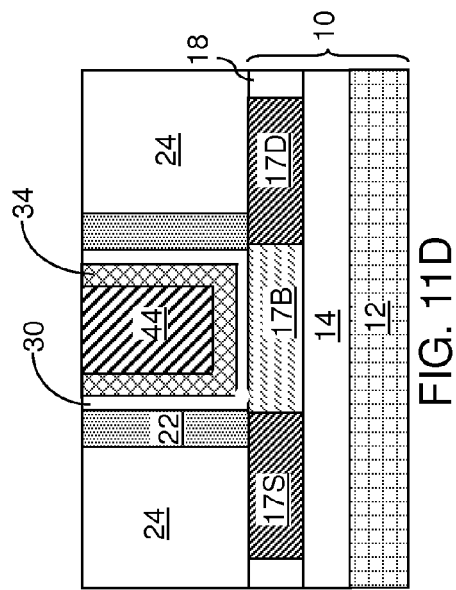
FIG. 11C is a vertical cross-sectional view of the first exemplary semiconductor structure of FIG. 11A along the vertical plane C-C'.
Figure 11D:
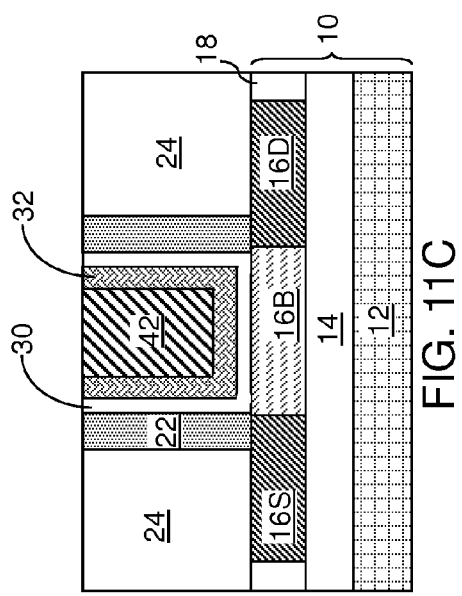
FIG. 11D is a vertical cross-sectional view of the first exemplary semiconductor structure of FIG. 11A along the vertical plane D-D'.
Figure 11E:
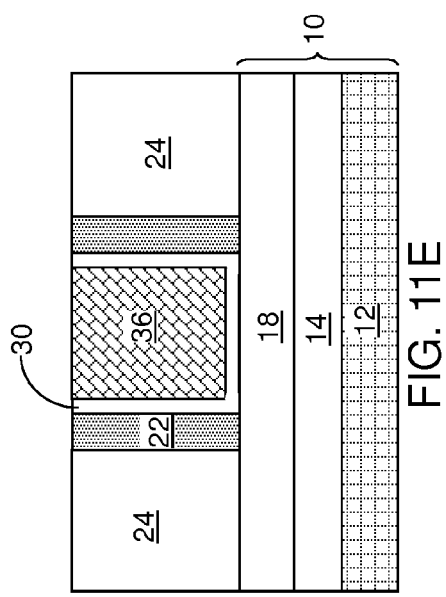
FIG. 11E is a vertical cross-sectional view of the first exemplary semiconductor structure of FIG. 11A along the vertical plane E-E'.
Figure 12C:
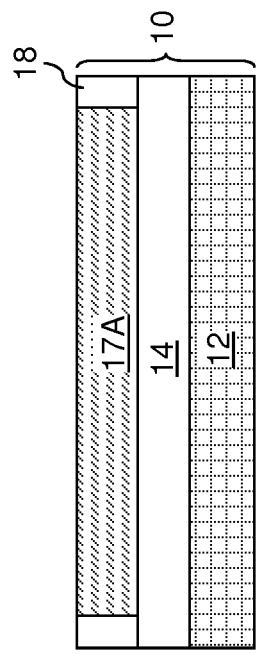
FIG. 12C is a vertical cross sectional view of the first exemplary semiconductor structure of FIG. 12A along the vertical plane C-C'.
Figure 12D:
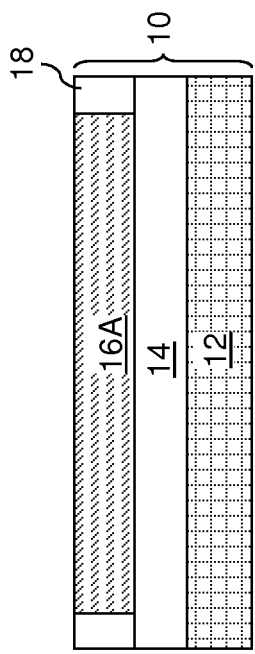
FIG. 12D is a vertical cross sectional view of the first exemplary semiconductor structure of FIG. 12A along the vertical plane D-D'.
Figure 12E:
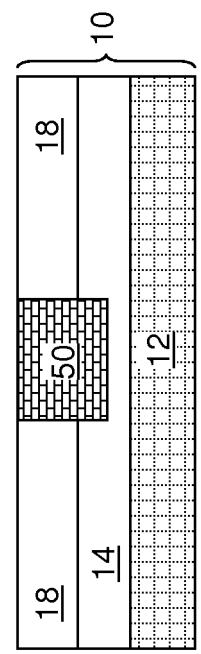
FIG. 12E is a vertical cross-sectional view of the first exemplary semiconductor structure of FIG. 12A along the vertical plane E-E'.
Figure 13D:
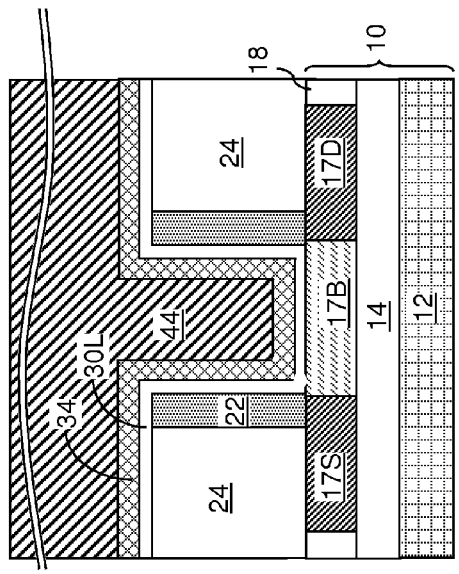
FIG. 13D is a vertical cross sectional view of the second exemplary semiconductor structure of FIG. 13A along the vertical plane D-D'.
Figure 13C:
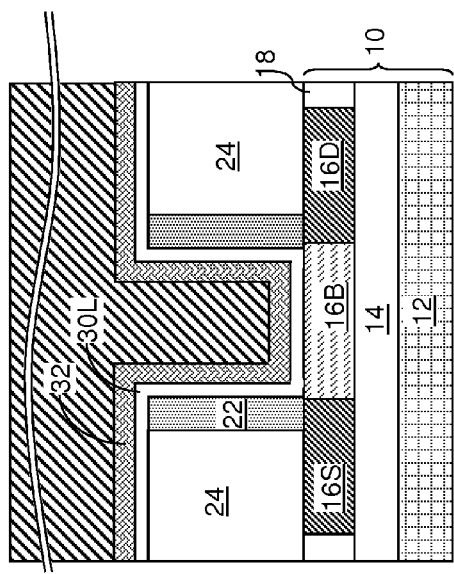
FIG. 13C is a vertical cross sectional view of the second exemplary semiconductor structure of FIG. 13A along the vertical plane C-C'.
Figure 13E:
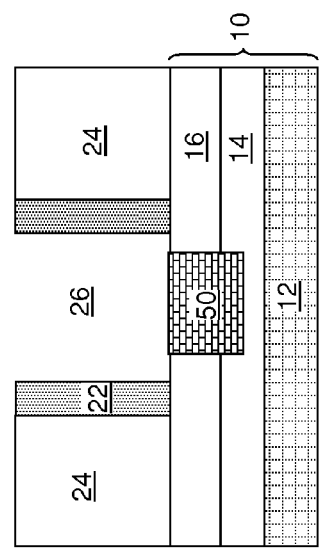
FIG. 13E is a vertical cross-sectional view of the second exemplary semiconductor structure of FIG. 13A along the vertical plane E-E'.
Figure 14D:
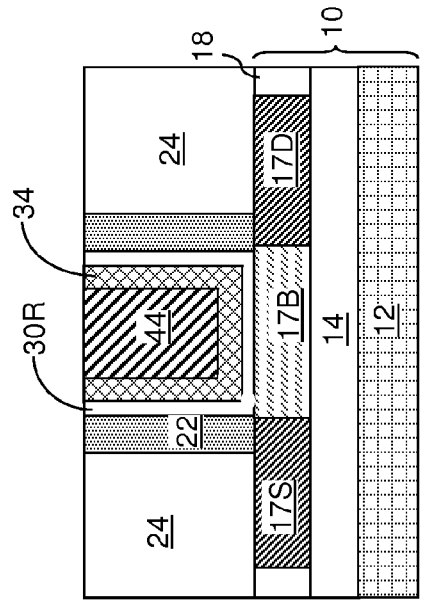
FIG. 14D is a vertical cross sectional view of the second exemplary semiconductor structure of FIG. 14A along the vertical plane D-D'.
Figure 14C:
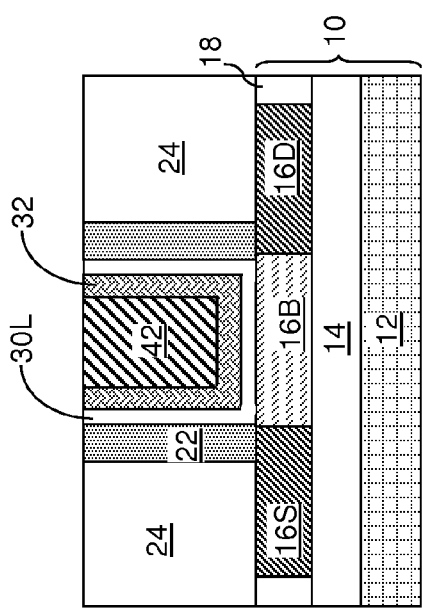
FIG. 14C is a vertical cross sectional view of the second exemplary semiconductor structure of FIG. 14A along the vertical plane C-C'.
Figure 14E:
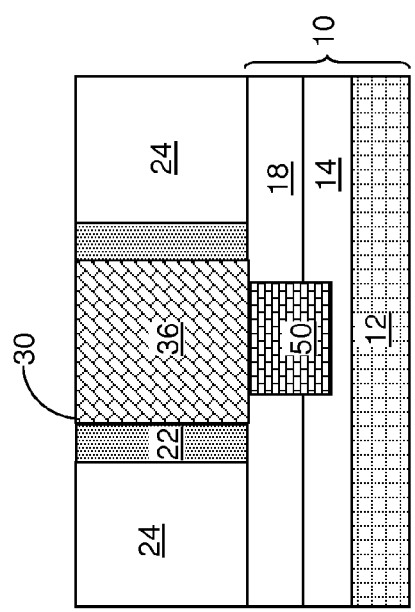
FIG. 14E is a vertical cross-sectional view of the second exemplary semiconductor structure of FIG. 14A along the vertical plane E-E'.
Figures 15A, 15B:
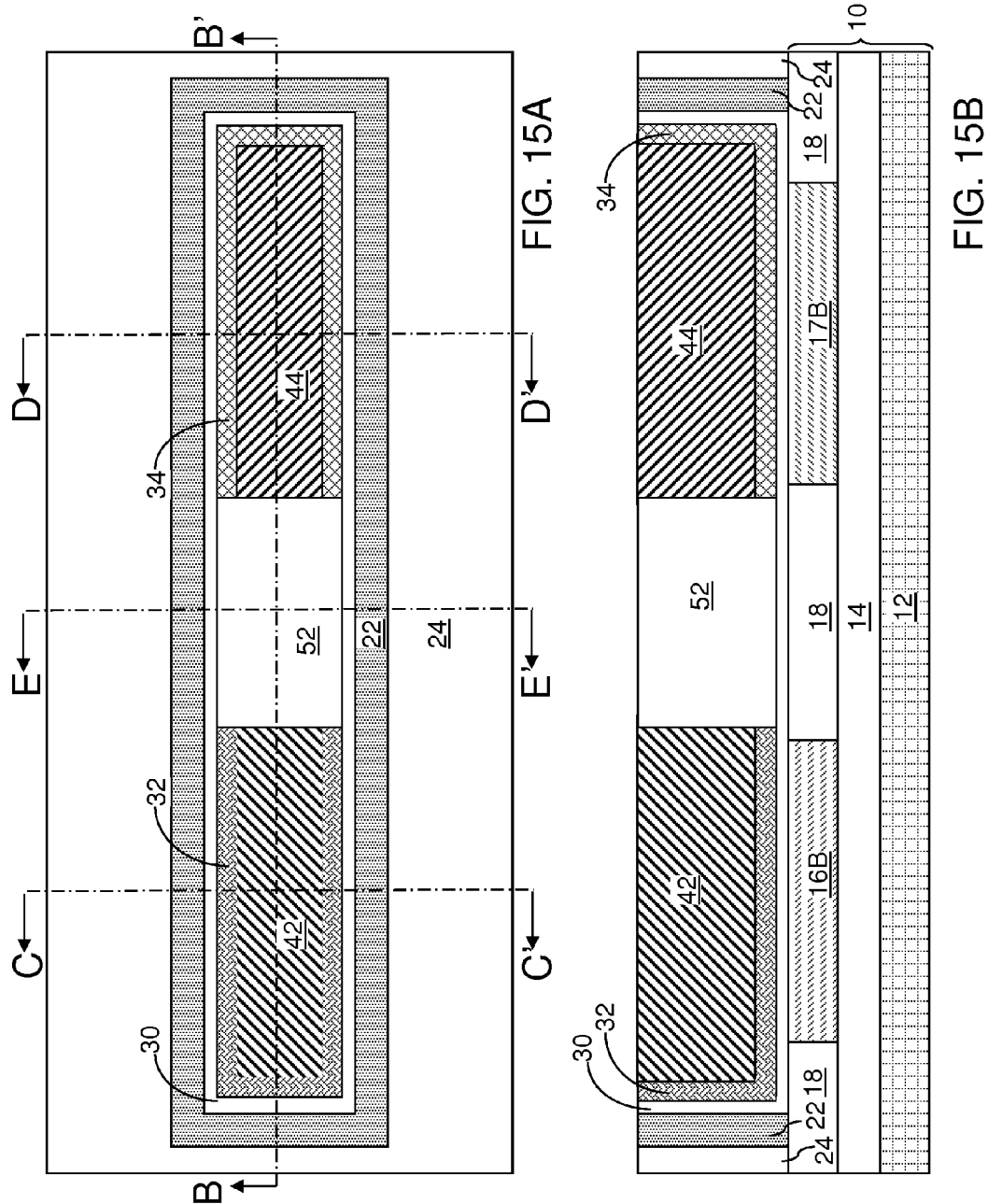
FIG. 15A is a top-down view of the first exemplary semiconductor structure of FIG. 10A after formation of a dielectric fill material between the first material stack and the second material stack in accordance with yet another embodiment of the present application.
FIG. 15B is a vertical cross sectional view of the second exemplary semiconductor structure of FIG. 15A along the vertical plane B-B'.
Figure 15D:
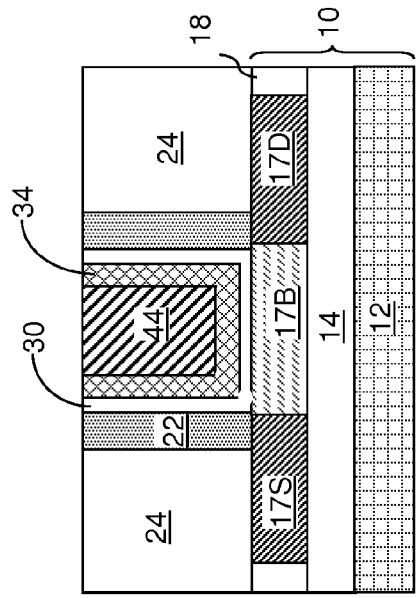
FIG. 15D is a vertical cross sectional view of the second exemplary semiconductor structure of FIG. 15A along the vertical plane D-D'.
Figure 15C:
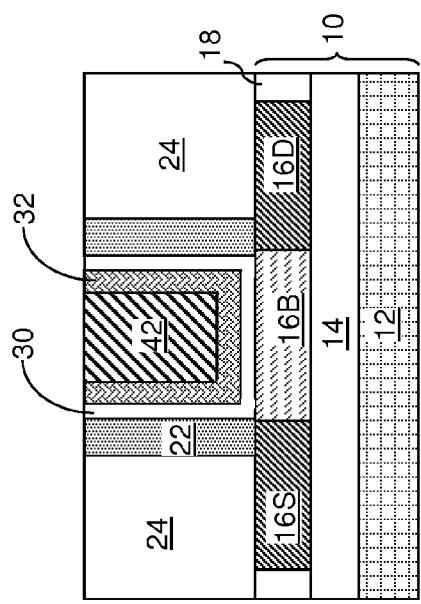
FIG. 15C is a vertical cross sectional view of the second exemplary semiconductor structure of FIG. 15A along the vertical plane C-C'.
Figure 15E:
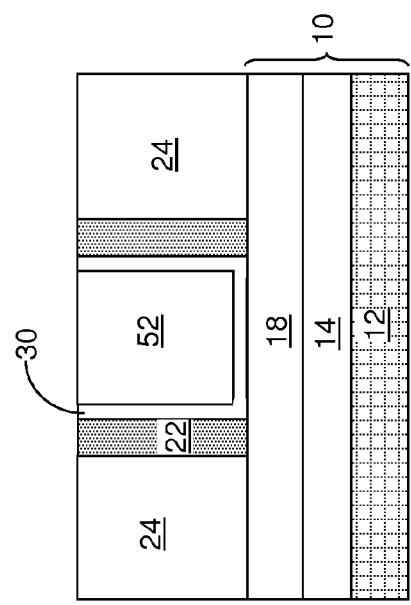
FIG. 15E is a vertical cross-sectional view of the second exemplary semiconductor structure of FIG. 15A along the vertical plane E-E'.
Figure 16B:
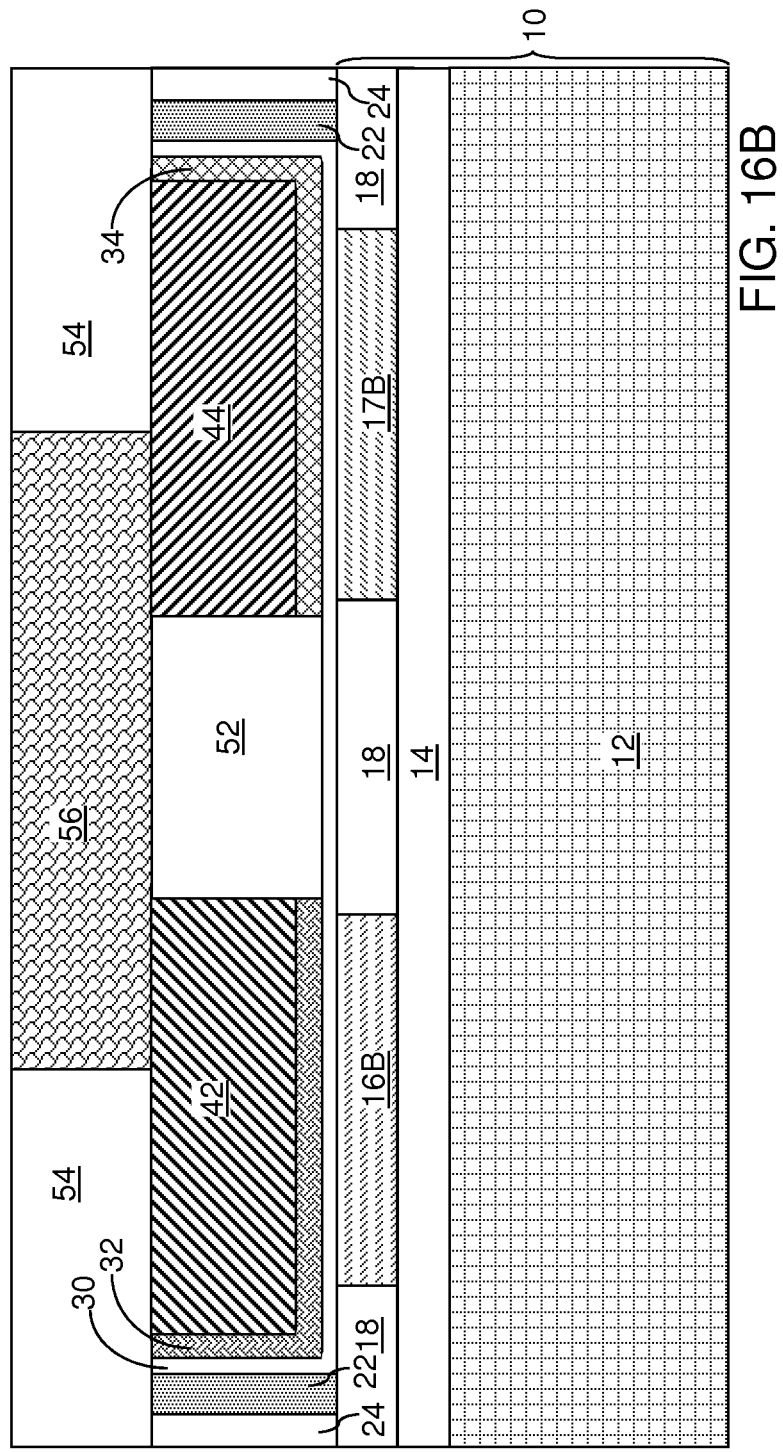
FIG. 16B is a vertical cross sectional view of the second exemplary semiconductor structure of FIG. 16A along the vertical plane B-B'.
Figure 16C:
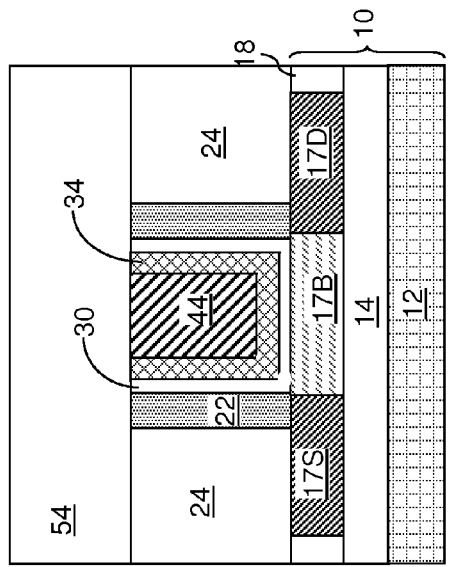
FIG. 16C is a vertical cross sectional view of the second exemplary semiconductor structure of FIG. 16A along the vertical plane C-C'.
Figure 16D:
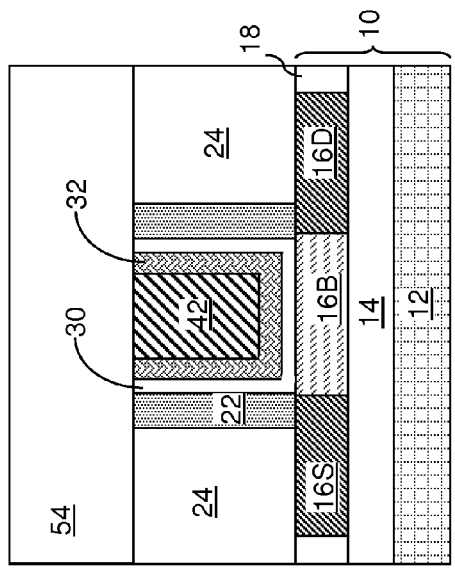
FIG. 16D is a vertical cross sectional view of the second exemplary semiconductor structure of FIG. 16A along the vertical plane D-D'.
Figure 16E:
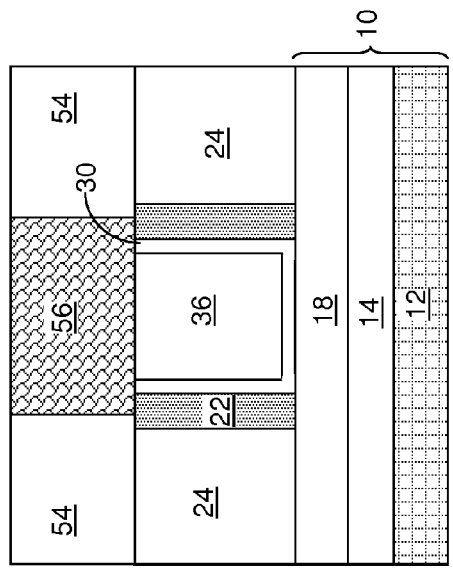
FIG. 16E is a vertical cross-sectional view of the second exemplary semiconductor structure of FIG. 16A along the vertical plane E-E'.

FIGS. 11A-11E illustrate a semiconductor structure in accordance with another embodiment of the present application. The semiconductor structure includes a first conductivity-type field effect transistor including a first type metal gate stack (i.e., elements 30, 32 and 44 shown in FIG. 11C) located above a first semiconductor material layer portion (i.e., element 16B) of a substrate (i.e., element 10) and a second conductivity-type field effect transistor including a second type metal gate stack (i.e., elements 30, 34 and 44 shown in FIG. 11D) located above a second semiconductor material layer portion (i.e., element 17B) of the substrate (i.e., element 10), wherein the second conductivity type is of a different conductivity type than the first conductivity type. The structure further includes a third type of metal gate stack (comprised of elements 32, 42, 34, 44 and 36 as shown in FIG. 11B) located above a trench isolation structure (i.e., element 18) that is positioned between the first semiconductor material layer portion (i.e., element 16B) and the second semiconductor material layer portion (i.e., element 17B). The third type of gate stack includes a portion of a first workfunction material layer (i.e., portion of element 32) and a portion of the first metal layer (i.e., element 44) both of the first conductivity-type field effect transistor, a portion of a second workfunction material layer (i.e., a portion of element 34) and a portion of the second metal layer 44) both of the second conductivity-type field effect transistor, and a low resistance metal layer (i.e., element 36). In this embodiment, the low resistance metal layer 36 has an uppermost surface that is substantially coplanar with an uppermost surface of each of the elements 32, 42, 34 and 44. Also, in this embodiment, a bottommost surface of the low resistance metal layer 36 directly contacts an uppermost surface of gate dielectric material layer 30 that is not covered by elements 32, 42, 34 and 44.

Referring now to FIGS. 12A-12E, there are illustrated a second exemplary semiconductor structure including a first semiconductor material layer portion 16A and a second semiconductor material layer portion 17B separated by a trench isolation structure 18 and a buried wire structure 50 according to a third embodiment of the present application. In this embodiment, the first and second semiconductor material layer portions 16A and 17A may also be fin structures and/or semiconductor nanowires. The second exemplary semiconductor structure also includes an insulator layer 14 and a handle substrate 12. As is shown, a bottommost surface of the buried wire structure 50 may extend beneath the uppermost surface of the insulator layer 14. As is also shown, the buried wiring structure 50 is separated from the first and second semiconductor material layer portions 16A, 17A by remaining portions of the trench isolation structure (not labeled separated in the drawings).

The second exemplary semiconductor structure is formed by first providing the first exemplary semiconductor structure shown in FIGS. 1A-1E of the present application. After providing the first exemplary semiconductor structure shown in FIGS. 1A-1E, the buried wiring region 50 is formed by first forming a trench (not shown) into a portion of the isolation trench structure 18 that is located between the first and second semiconductor material layer portions 16A, 17A. The trench can be formed by lithography and etching. The etch may include a dry etching process such as, for example a reactive ion etch. Following the formation of the trench, the patterned photoresist formed during the lithographic process can be removed by utilizing a conventional resist stripping process. Next, the trench is filled with a low resistance metal and then planarization is performed to form the buried wiring structure 50 shown in FIGS. 12A-12E.

The low resistance metal that is used in providing the buried wiring structure 50 includes one of the materials mentioned above for the low resistance metal layer 36 in the first embodiment of the present application. The low resistance metal can be formed utilizing one of the deposition techniques mentioned above in forming the low resistance metal layer 36. Planarization may include chemical mechanical polishing and/or grinding. After planarization, the buried wiring structure 50 has an uppermost surface that is substantially coplanar with each of the first and second semiconductor material layer portions 16A, 17A as well as the uppermost surface of each trench isolation structure 18.

Referring now to FIGS. 13A-13E, there are illustrated the second exemplary semiconductor structure of FIGS. 12A-12E after formation of a first material stack comprising a first gate dielectric material layer portion 30L, a first workfunction metal layer 32 and a first metal layer 42 and a second material stack comprising a second gate dielectric material layer portion 30R, a second workfunction metal layer 34 and a second metal layer 44 within a gate cavity 29 provided between the first semiconductor material layer portion 16A and the second semiconductor material layer portion 17A.

The structure shown in FIGS. 13A-13E is formed by first processing the second exemplary semiconductor structure shown in FIGS. 12A-12E utilizing the sequence of processing steps shown and described above in FIGS. 2A-2E through 4A-4E. Next, the sequence of processing steps performed in shown and described above in FIGS. 9A-9E through 10A-1E is performed. After performing the aforementioned sequence of processing steps, the exposed portion of the gate dielectric material layer 30 is removed from atop the buried wiring region 18 utilizing an etching process.

Referring now to FIGS. 14A-14E, there are illustrated the second exemplary semiconductor structure of FIGS. 13A-13E after formation of a low resistance metal layer 36 between the first material stack and the second material stack and above and in direct contact with a portion of the buried wire structure 18 and planarization.

The low resistance metal layer 36 used in this embodiment of the present application includes one of the materials mentioned above in providing the low resistance metal layer 36 to the first embodiment of the present application. The low-resistance metal layer 36 of this embodiment of the present application can be formed and have an as deposited thickness as mentioned in the first embodiment of the present application.

Following the formation of the low resistance metal layer 36, a planarization process such as chemical mechanical polishing and/or grinding can be employed to remove the low resistance metal layer and the first and second workfunction metal layers 32, 34 from atop the uppermost horizontal surfaces of the dielectric spacer 26 and dielectric material 20.

FIGS. 14A-14E illustrate a semiconductor structure in accordance with a still further embodiment of the present application. The semiconductor structure of this embodiment is similar in structure to the semiconductor structure shown in FIGS. 11A-11E except that a buried wiring region 50 is present in a portion of the trench isolation structure 18. In this structure, a bottommost surface of the low resistance metal layer 36 directly contacts an uppermost surface of buried wiring region 50.

Referring now to FIGS. 15A-15E, there are illustrated the first exemplary semiconductor structure of FIGS. 10A-10E after formation of a dielectric fill material 52 between the first material stack and the second material stack in accordance with yet another embodiment of the present application. The dielectric film material 52 may include a semiconductor oxide, semiconductor nitride and/or a semiconductor oxynitride. In one embodiment, the dielectric fill material 52 may be silicon dioxide and/or silicon nitride. The dielectric fill material 52 can be formed utilizing a deposition process such as, for example, chemical vapor deposition or chemical vapor deposition. Following the deposition of the dielectric fill material 52 a planarization process such as, for example chemical mechanical polishing and/or grinding can be employed to provide the structure shown in FIGS. 15A-15E. As is shown, the uppermost surface of the dielectric film material 52 is substantially coplanar with an uppermost layer of each of the first material stack and the second material stack. As is also shown, the dielectric fill material 52 is located above the trench isolation structure 18 that is positioned between the two different device regions.

Referring now to FIGS. 16A-16E, there are illustrated the first exemplary semiconductor structure of FIGS. 15A-15E after formation of a structure including a second dielectric material 54 having a low resistance metal region 56 embedded therein and atop a portion of both the first material stack and the second material stack. Notably, direct contact is made between a bottommost surface of the low resistance metal region 56 and an uppermost surface of the first material stack, i.e., first metal layer 42, and direct contact is made between a bottommost surface of the low resistance metal region 56 and an uppermost surface of the second material stack, i.e., second metal layer 44.

The second dielectric material layer 54 may include one of the dielectric materials mentioned above for dielectric material 24. The second dielectric material layer can be formed utilizing one of the techniques mentioned above for forming the dielectric material 24. After forming a blanket layer of the second dielectric material layer 54, an opening is formed into the second dielectric material layer 54 by lithography and etching. The opening that is provided in the second dielectric material layer 54 is then filled with a low resistance metal. The low resistance metal used in this embodiment of the present application includes one of the materials mentioned above in providing the low resistance metal layer 36 to the first embodiment of the present application. The low resistance metal of this embodiment of the present application can be formed as mentioned in the first embodiment of the present application. Following the deposition of the low resistance metal, a planarization process may be performed to provide the structure shown in FIGS. 16A-16E.

FIGS. 16A-16E illustrates a semiconductor structure in accordance with an even further embodiment of the present application. The semiconductor structure includes a first conductivity-type field effect transistor including a first type of metal gate stack (i.e., elements 30, 32 and 42 shown in FIG. 16C) located above a first semiconductor material layer portion (i.e., element 16B) of a substrate (i.e., element 10) and a second conductivity-type field effect transistor including a second type of metal gate stack (i.e., elements 30, 34, and 44 shown in FIG. 16D) located above a second semiconductor material layer portion (i.e., element 17B) of the substrate (i.e. element 10), wherein the second conductivity type is of a different conductivity type than the first conductivity type. The structure further includes a third type of metal gate stack located above a trench isolation structure (i.e., element 18) that is positioned between the first semiconductor material layer portion (i.e., element 16B) and the second semiconductor material layer portion (i.e., element 17B). In this embodiment, the third type of metal gate stack includes a first material stack comprising, from bottom to top, a portion of a first workfunction material layer (i.e., element 32) of the first conductivity-type field effect transistor, and a portion of a first metal layer (i.e., element 42) of the first conductivity-type field effect transistor, a second material stack comprising, from bottom to top a portion of a second workfunction material layer (i.e. element 34) of the second conductivity-type field effect transistor and a portion of a second metal layer (i.e., element 44) of the second conductivity-type field effect transistor, wherein the first material stack and the second material stack are spaced apart by a dielectric fill material (i.e., element 52). A low resistance metal region (i.e. element 56) is located above the dielectric fill material (i.e., element 52), the first material stack and the second material stack (see for example, the structure above the trench isolation structure 18 shown in FIG. 16B).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first conductivity-type field effect transistor including a first type of metal gate stack located above a first semiconductor material layer portion of a substrate;
a second conductivity-type field effect transistor including a second type of metal gate stack located above a second semiconductor material layer portion of said substrate, wherein said second conductivity type is of a different conductivity type than said first conductivity type; and
a third type of metal gate stack located above a trench isolation structure that is positioned between said first semiconductor material layer portion and said second semiconductor material layer portion, wherein said third type of metal gate stack comprises:
a first material stack comprising, from bottom to top, a portion of a first workfunction metal layer of said first conductivity-type field effect transistor, and a portion of a first metal layer of said first conductivity-type field effect transistor,
a second material stack comprising, from bottom to top a portion of a second workfunction metal layer of said second conductivity-type field effect transistor and a portion of a second metal layer of said second conductivity-type field effect transistor, wherein said first material stack and said second material stack are spaced apart by a dielectric fill material, and
a dielectric material layer located directly on a portion of a topmost surface of each of said first and second type metal gate stacks, wherein a low resistance metal region is embedded in an opening present in said dielectric material layer, wherein said opening exposes a portion of said first and second type metal gate stacks and an entirety of said dielectric fill material such that said low resistance metal region contacts each of said first type metal gate stack, said dielectric fill material and said second type metal gate stack, and wherein said dielectric fill material has a bottommost surface that is direct physical contact with a portion of a gate dielectric material layer.

2. The semiconductor structure of claim 1, wherein a bottommost surface of said low resistance metal region contacts an uppermost surface of each of said dielectric fill material, said first material stack and said second material stack.

3. The semiconductor structure of claim 1, wherein said bottommost surface of said dielectric fill material is coplanar with a bottommost surface of each of said portion of said first workfunction metal layer of said third type metal gate structure and said portion of said second workfunction metal layer of said third type of metal gate stack.

4. The semiconductor structure of claim 1, wherein said gate dielectric material layer is a continuous U-shaped gate dielectric material located beneath each of said first type of metal gate stack, said second type of metal gate stack and said third type of metal gate stack.

5. The semiconductor structure of claim 4, wherein a topmost surface of said continuous U-shaped gate dielectric material is coplanar with said topmost surface of each of said first and second type metal gate stacks and a topmost surface of said dielectric fill material.

6. The semiconductor structure of claim 1, wherein said substrate comprises an insulator layer of a semiconductor-on-insulator substrate.

7. The semiconductor structure of claim 1, wherein said low resistance metal region comprises a metal having a conductivity of $1.79 \times 10^7$ S/m or greater.

8. The semiconductor structure of claim 7, wherein said metal is tungsten, aluminum or copper.

9. The semiconductor structure of claim 1, further comprising a dielectric spacer laterally surrounding said first conductivity-type field effect transistor, said second conductivity-type field effect transistor and said third type of metal gate stack.

10. The semiconductor structure of claim 9, further comprising a second dielectric material layer adjoining said dielectric spacer, wherein said second dielectric material layer has a topmost surface that is substantially coplanar with a topmost surface of said dielectric spacer.

11. The semiconductor structure of claim 1, wherein said first workfunction metal layer is a p-type workfunction metal and said second workfunction metal layer is an n-type workfunction metal.

12. The semiconductor structure of claim 1, wherein said first workfunction metal layer is an n-type workfunction metal and said second workfunction metal layer is a p-type workfunction metal.

13. The semiconductor structure of claim 1, wherein a topmost surface of each of said first semiconductor material layer portion, said second semiconductor material layer portion and said trench isolation structure is coplanar with one another.

* * * * *